US012564068B2

(12) United States Patent
Ravi et al.

(10) Patent No.: US 12,564,068 B2
(45) Date of Patent: Feb. 24, 2026

(54) CARBON ASSISTED SEMICONDUCTOR DICING AND METHOD

(71) Applicant: ThinSiC Inc, Santa Clara, CA (US)

(72) Inventors: Tirunelveli Subramaniam Ravi, San Jose, CA (US); Stephen Daniel Miller, San Jose, CA (US); Jinho Seo, Saratoga, CA (US); Ashraf Ahmed El dakrouri, Santa Clara, CA (US)

(73) Assignee: ThinSiC Inc., Santa Clara, CA (US)

( * ) Notice: Subject to any disclaimer, the term of this patent is extended or adjusted under 35 U.S.C. 154(b) by 487 days.

(21) Appl. No.: 17/961,136

(22) Filed: Oct. 6, 2022

(65) Prior Publication Data

US 2024/0120284 A1    Apr. 11, 2024

(51) Int. Cl.
*H01L 23/544* (2006.01)
*H01L 21/263* (2006.01)
*H01L 21/78* (2006.01)

(52) U.S. Cl.
CPC ........ *H01L 23/544* (2013.01); *H01L 21/2636* (2013.01); *H01L 21/78* (2013.01)

(58) Field of Classification Search
None
See application file for complete search history.

(56) References Cited

U.S. PATENT DOCUMENTS

| | | | |
|---|---|---|---|
| 6,259,058 B1* | 7/2001 | Hoekstra | B23K 26/40 |
| | | | 219/121.75 |
| 6,509,546 B1* | 1/2003 | Egitto | H05K 3/0038 |
| | | | 219/121.75 |
| 8,551,817 B2 | 10/2013 | Fukumitsu et al. | |
| 8,609,512 B2 | 12/2013 | Pirogovsky et al. | |
| 8,624,153 B2 | 1/2014 | Atsumi et al. | |
| 8,685,838 B2 | 4/2014 | Fukuyo et al. | |
| 8,852,698 B2 | 10/2014 | Fukumitsu | |
| 8,927,900 B2 | 1/2015 | Fukuyo et al. | |
| 9,352,414 B2 | 5/2016 | Atsumi et al. | |
| 9,543,207 B2 | 1/2017 | Fujii et al. | |
| 9,837,315 B2 | 12/2017 | Fukuyo et al. | |
| 10,654,133 B2 | 5/2020 | Koitzsch et al. | |
| 11,072,042 B2 | 7/2021 | Sekiya | |
| 11,222,823 B2 | 1/2022 | Sekiya | |
| 11,276,588 B2 | 3/2022 | Sekiya | |
| 11,389,920 B2 | 7/2022 | Sekiya | |
| 11,424,162 B2 | 8/2022 | Fujii et al. | |
| 2004/0002199 A1* | 1/2004 | Fukuyo | C03B 33/023 |
| | | | 438/106 |

(Continued)

*Primary Examiner* — Erik T. K. Peterson

(57) ABSTRACT

A semiconductor substrate is configured for dicing into separate die or individual semiconductor devices. The semiconductor substrate can comprise silicon, silicon carbide, or gallium nitride. A dicing grid bounds each semiconductor device on the semiconductor substrate. A die singulation process is configured to occur in the dicing grid. Material is coupled to the dicing grid. In one embodiment, the material can comprise carbon. A laser is configured to couple energy to the material coupled to the dicing grid. The energy from the laser heats the material. The heat from the material or the temperature differential between the material and the dicing creates a thermal shock that generates a vertical fracture in the semiconductor substrate that separates the semiconductor device from the remaining semiconductor substrate.

21 Claims, 30 Drawing Sheets

(56)           References Cited

U.S. PATENT DOCUMENTS

| | | | | |
|---|---|---|---|---|
| 2004/0137702 | A1* | 7/2004 | Iijima | H01L 21/78 |
| | | | | 257/E23.179 |
| 2004/0241934 | A1* | 12/2004 | Inoue | H01L 21/02488 |
| | | | | 438/222 |
| 2005/0006728 | A1* | 1/2005 | Shizuno | H01L 22/34 |
| | | | | 257/642 |
| 2006/0091126 | A1* | 5/2006 | Baird | B23K 26/40 |
| | | | | 219/121.72 |
| 2007/0252154 | A1* | 11/2007 | Uchiyama | B28D 5/0011 |
| | | | | 438/105 |
| 2008/0088900 | A1* | 4/2008 | Hie | B23K 26/0736 |
| | | | | 359/201.1 |
| 2008/0191121 | A1* | 8/2008 | Yoo | B23K 26/40 |
| | | | | 250/201.4 |
| 2009/0280623 | A1* | 11/2009 | Kurita | B23K 26/0613 |
| | | | | 257/E21.318 |
| 2010/0025387 | A1* | 2/2010 | Arai | B29C 65/1654 |
| | | | | 219/121.73 |
| 2010/0190296 | A1* | 7/2010 | Kawana | H01L 21/6835 |
| | | | | 257/E21.599 |
| 2010/0233867 | A1* | 9/2010 | Akiyama | H01L 21/3043 |
| | | | | 438/464 |
| 2011/0000897 | A1 | 1/2011 | Nakano et al. | |
| 2011/0001220 | A1 | 1/2011 | Sugiura et al. | |
| 2011/0037149 | A1 | 2/2011 | Fukuyo et al. | |
| 2011/0240616 | A1* | 10/2011 | Osako | B23K 26/0626 |
| | | | | 219/121.72 |
| 2019/0047894 | A1* | 2/2019 | Heiss | C03B 33/091 |
| 2021/0031308 | A1* | 2/2021 | Nara | B23K 26/0676 |
| 2021/0217663 | A1* | 7/2021 | Nähle | H01L 21/268 |

* cited by examiner

100

100

CARBON ASSISTED SEMICONDUCTOR DICING AND METHOD

FIELD

This invention relates to semiconductor device manufacture, and in particular to methods of separating semiconductor die from one another.

BACKGROUND

The use of wide bandgap (WBG) semiconductors has increased dramatically in recent years in power electronics. Their ability to operate efficiently at higher voltages, powers, temperatures, and switching frequencies has enabled reduced cooling requirements, lower part counts, and the use of smaller passive components. WBG-based power electronics can further reduce the footprint and potentially the system cost of various renewable energy electrical equipment such as motor drivers and inverters.

Among the WBG semiconductors for power electronics, Silicon Carbide (SiC) has now been increasingly used for high voltage drivers (>1200V) whereas Gallium Nitride (GaN) has been experiencing increased use in both higher power and higher frequency applications. From the substrate standpoint, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps.

As a semiconductor substrate for WBG semiconductors is being produced and devices that use high currents are fabricated, defects play a larger role and are magnified because die sizes are larger and any defect will contribute to more significant yield loss and potential lower reliability. Therefore, to maximize die yield, any cost reduction activity regarding the substrate is paramount while also maintaining low defect densities in the active epitaxial layer. The cost of dicing the semiconductor substrate is one area that affects cost, defectivity, and useable area on the semiconductor substrate. Using a common method such as a saw to cut through material as hard as silicon carbide to separate die is not efficient. Using a laser to heat and cut a semiconductor substrate can produce thermal damage that could impact die yields. Laser systems that can cut substrates such as silicon carbide or gallium nitride can also be very costly.

A first prior art method of singulation uses the process of mounting a semiconductor substrate with fully fabricated die on a blue tape with a mounting ring and then using a diamond saw to physically cut a substrate along a dicing grid such that each device or integrated circuit are physically separated from adjacent die. The prior art method of singulation of using a diamond saw requires a wide dicing grid so that die are not affected by the dicing process including potential losses due to chipping, cracking, and breakage. In addition, singulation using a sawing method also produces a lot of debris including particulates that is washed away by continuous flow of wafer. In some cases, exposure to water may affect the functionality or reliability of a separated die and particulates produced by the sawing operation may adhere to the surface of the die, thereby affecting its function or reliability. In addition, by requiring a wider dicing grid, the number of usable die on a substrate is reduced thereby increasing the cost, especially when the initial substrate cost is high such as silicon carbide or gallium nitride devices. In addition, the method of sawing is comparatively slow, especially when the number of die per wafer is large and thereby increases the capital cost and cost of ownership.

A second prior art technique used for singulation of die is the use of a laser which may be used to physically separate the die by focusing laser energy onto a small area for a very short time causing the substrate to sublime and evaporate. Another version of laser dicing is called stealth dicing in which the laser energy is focused below the substrate and forming a modified layer below the surface and then using expansion of the mounting tape to singulate the die. The laser dicing process is a dry process and can produce more die per wafer since the dicing grid can be made narrow with significant reduction in kerf loss as compared to sawing. However, the technique uses lasers that can be quite expensive and also needs to be precisely focused on the dicing grid.

Accordingly, it is desirable to provide a system to separate die on a semiconductor substrate that minimizes die spacing, reduces damage to the semiconductor substrate, and lowers cost.

BRIEF DESCRIPTION OF THE DRAWINGS

Various features of the system are set forth with particularity in the appended claims. The embodiments herein, can be understood by reference to the following description, taken in conjunction with the accompanying drawings, in which:

DETAILED DESCRIPTION

Figures 1, 2:
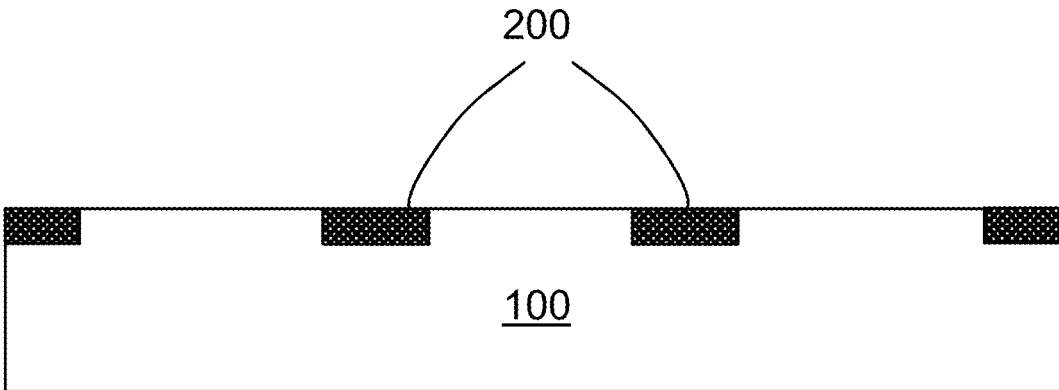
FIG. 1 is an illustration of a semiconductor substrate in accordance with an example embodiment.
FIG. 2 is an illustration of a shallow trench isolation for a NMOS transistor of a CMOS device in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current example is described with an example embodiment in the fabrication of a CMOS device using a silicon wafer as the starting substrate. While a silicon substrate is used in the example embodiment, other semiconductor substrates can be used in the dicing process. Thus, semiconductor substrates such as compound semiconductors like gallium arsenide, silicon carbide, gallium nitride, indium phosphide can be diced using the dicing process disclosed herein below. Similarly, a CMOS device is used as an example embodiment, but other device types or integrated circuits may be formed on a die. In fact, the type of device or integrated circuit formed may correspond to the semiconductor substrate chosen. The semiconductor die of the semiconductor substrate can comprise power devices, integrated circuits, memory devices, photonic devices, lasers, light emitting diodes, RF devices, sensors, actuators, to name but a few.

FIG. 1 illustrates a semiconductor substrate 100 in accordance with an example embodiment. As mentioned previously, semiconductor substrate 100 can be silicon, gallium arsenide, silicon carbide, gallium nitride, indium phosphide or comprise other materials in which a semiconductor device can be formed. In the example embodiment, semiconductor substrate 100 is silicon. In the example embodiment, NMOS devices are formed in semiconductor substrate 100 to illustrate one or more devices being formed in semiconductor substrate 100. Semiconductor substrate 100 is composed of single crystal silicon and doped with n or p type dopants such as arsenic, antimony, phosphorus, boron etc. In the example embodiment, substrate 100 is doped with p-type dopant with boron. Although not shown, PMOS devices could also be formed with the NMOS devices to form complementary MOS devices to form digital or analog integrated circuits as is well known in the art. In the example shown herein below, only a portion of semiconductor substrate 100 is illustrated. The process steps disclosed herein below form devices or integrated circuits occurs over the entire semiconductor substrate 100. In general, an integrated circuit or device is replicated over the entire semiconductor substrate 100. Each circuit or device on semiconductor substrate 100 is separated from each other with a dicing process that will be disclosed herein to form individual die. The individual die can be packaged or the die itself mounted or coupled to other circuitry as part of an electronic system. Thus, it should be understood that the semiconductor substrate 100 will comprise a plurality of devices or a plurality of integrated circuits where each device or integrated circuit is a die that is separated from each other by the dicing process.

FIG. 2 illustrates a plurality of isolation regions 200 formed in semiconductor substrate 100. In the example embodiment, the plurality of isolation regions 200 forms a shallow trench isolation (STI) used for the isolation of individual transistors to prevent cross-talk between adjacent devices and allow for termination of electric fields in the semiconductor devices formed by subsequent fabrication steps. Different isolation schemes may be used for the fabrication of CMOS devices including LOCOS, Recessed LOCOS, Shallow Trench, or Deep Trench Isolation among other techniques. In the example embodiment, Shallow Trench Isolation is used for the isolation of the NMOS transistors being formed on or in semiconductor substrate 100. In the implementation of the STI process, shallow trenches are etched into the semiconductor substrate 100 using RIE (Reactive Ion Etching) and then refilled with patterned oxide growth and deposition with planarization such that only silicon oxide is left in the trenches and removed from the top surface of the semiconductor substrate 100. The details of the implementation of the STI will be well known to those skilled in the art.

Figure 3:
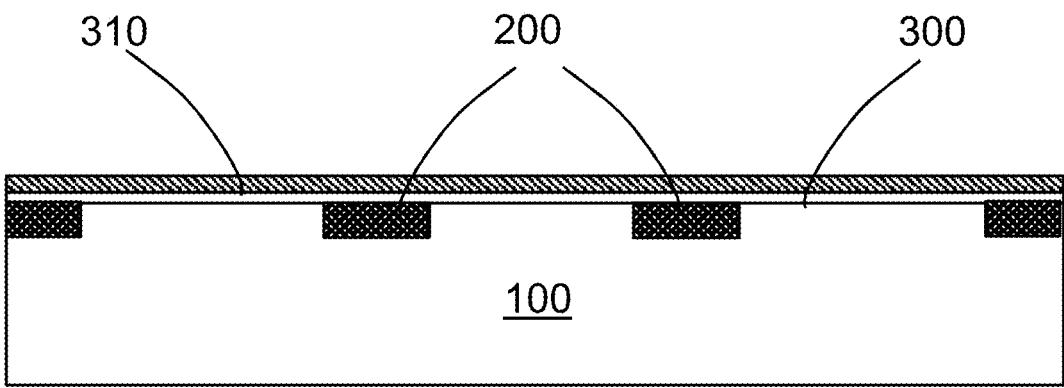
FIG. 3 is an illustration of a gate oxide layer and a gate polysilicon layer formed on the semiconductor substrate in accordance with an example embodiment.

FIG. 3 illustrates a gate oxide layer 300 and a gate polysilicon layer 310 formed on semiconductor substrate 100 in accordance with an example embodiment. In the example embodiment, gate oxide 300 is grown on the surface of semiconductor substrate 100 using a thermal growth process in a furnace at an elevated temperature between 900-1100 C and flowing dry oxygen gas over the surface of semiconductor substrate 100. The oxygen gas chemically reacts with the silicon to form silicon dioxide which is a high quality insulator for the implementation of a gate of a NMOS transistor of the CMOS device of the example embodiment. In one embodiment, a thickness of gate oxide layer 300 is between 50-300 Angstroms. Gate polysilicon layer 310 is used to form a gate electrode of a NMOS transistor. In the example embodiment, gate polysilicon layer 310 is composed of LPCVD (Low Pressure Chemical Vapor Deposition) polycrystalline silicon or polysilicon which is doped either in-situ (during deposition) or subsequently using different doping techniques such as ion implantation, gas phase or vapor phase doping using n or p type dopants to form a highly conductive layer for the gate electrode of the NMOS transistor of the CMOS device. In one embodiment, a thickness of gate polysilicon layer 310 is between 2000-4000 Angstroms. In an implementation of a NMOS transistor, other processes may be implemented such as $V_{th}$ (threshold voltage) adjust implant, to adjust the threshold voltage of a NMOS transistor of the CMOS device, as will be evident to those skilled in the art.

Figure 4:
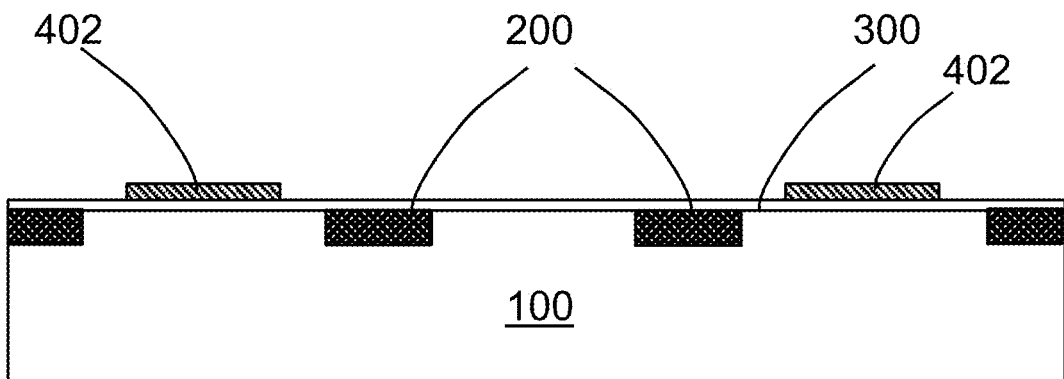
FIG. 4 is an illustration of a patterned gate polysilicon layer over the gate oxide layer in accordance with an example embodiment.

FIG. 4 illustrates a patterned gate polysilicon layer 402 over gate oxide layer 300 in accordance with an example embodiment. In the example embodiment, gate polysilicon layer 310 from FIG. 3 is patterned lithographically and then etched using RIE (Reactive Ion Etching) to form patterned gate polysilicon layer 402. In the example embodiment, patterned gate polysilicon layer 402 forms the gates of the NMOS transistors on or in semiconductor substrate 100. Gate polysilicon layer 310 is patterned lithographically using a stepper and photosensitive polymer called photoresist with a reticle forming a mask with computer generated patterns using EDA (Electronic Design Automation) tools. Patterned gate polysilicon layer 402 is then patterned by selectively removing portions of gate polysilicon layer 310 using RIE. Patterned gate polysilicon layer 402 may have a length from 10 nm to several microns as defined by lithography and etch.

Figure 5:
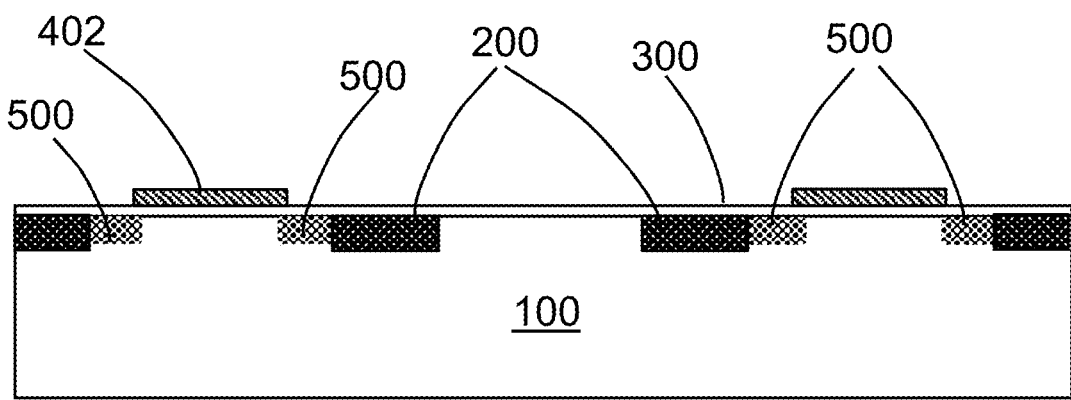
FIG. 5 illustrates a formation of source and drain regions in accordance with an example embodiment.

FIG. 5 illustrates the formation of source or drain regions 500 in accordance with an example embodiment. In the example embodiment, dopants species of suitable type, dose and energy are implanted through gate oxide layer 300 with a mask. The dose and energy of the implanted dopants are determined using TCAD (Technology Computer Aided Design) tools to simulate the fabrication process. The implanted dopants are then activated with an anneal process which may be done in a furnace or RTA (Rapid Thermal Anneal) tool. The thermal profile used in the activation anneal determines the depth and lateral diffusion of the source or drain regions 500 of the NMOS transistors being formed in semiconductor substrate 100.

Figure 6:
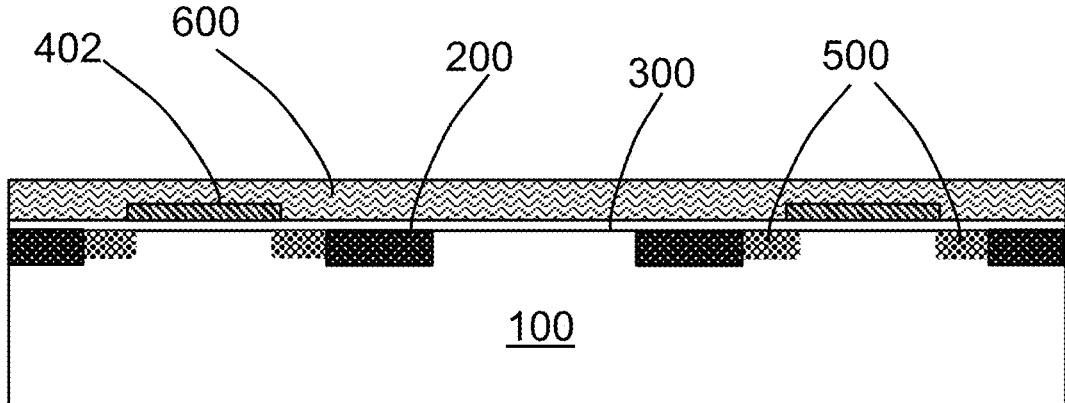
FIG. 6 is an illustration of a formation of a dielectric isolation layer overlying source and drain regions in accordance with an example embodiment.

FIG. 6 illustrates the formation of a dielectric isolation layer 600 overlying source or drain regions 500 in accordance with an example embodiment; Dielectric isolation layer 600 is a silicon dioxide layer and is deposited using a PECVD (Plasma Enhanced Chemical Vapor Deposition) process at a temperature of about 350-450 C which does not affect the junction depth of the NMOS transistors formed on or in semiconductor substrate 100. Dielectric isolation layer 600 is meant to protect the source, gate and drain regions of the NMOS transistors from environmental effects including particulates and moisture. Dielectric isolation layer 600 covers the entire surface of semiconductor substrate 100 and is subsequently patterned to enable the proper functioning of the NMOS devices being formed on or in semiconductor substrate 100.

Figure 7:
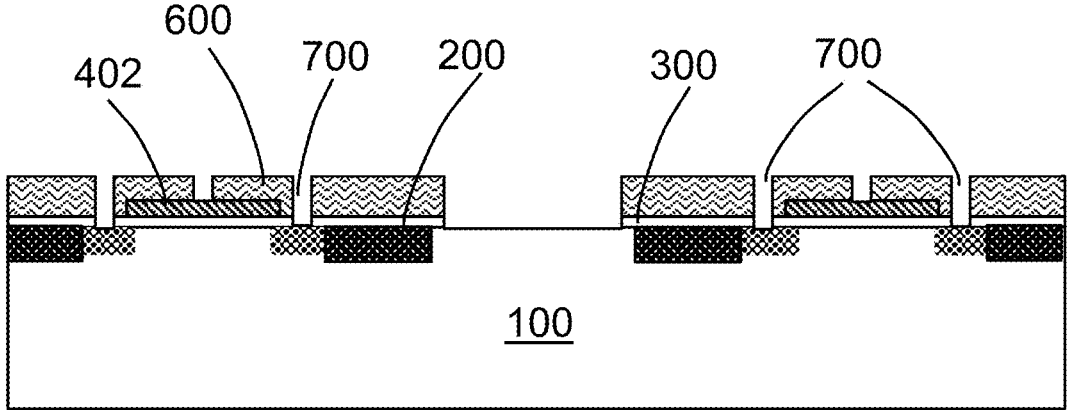
FIG. 7 is an illustration of formation of contact openings in the dielectric isolation layer in accordance with an example embodiment.

FIG. 7 illustrates formation of contact openings 700 in dielectric isolation layer 600 in accordance with an example embodiment. Contact openings 700 are formed by patterning and etching dielectric isolation layer 600 using lithography and RIE (Reactive Ion Etching). Contact openings 700 provide connection to different terminals of the NMOS transistors in the example embodiment. In addition, dielectric isolation layer 600 between adjacent NMOS transistor devices are also removed, to facilitate subsequent processing steps as will be described herein below.

Figure 8:
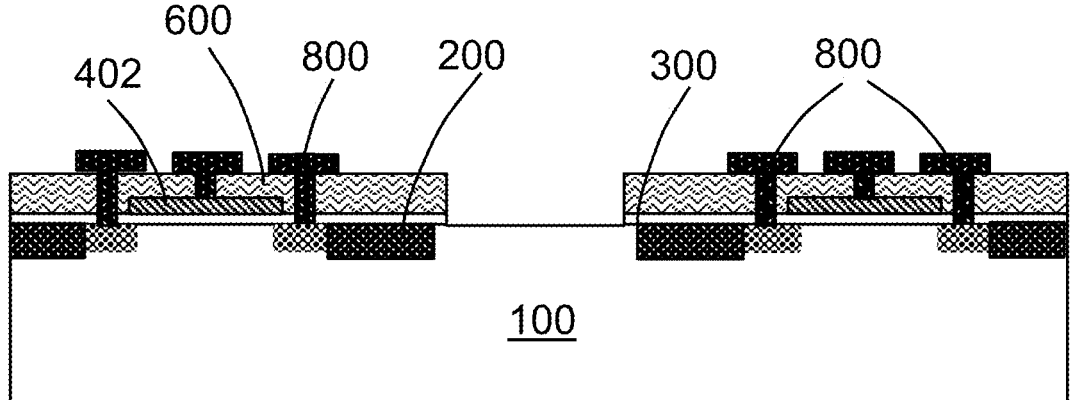
FIG. 8 is an illustration of a formation of metallic interconnects in the NMOS transistors in accordance with an example embodiment.

FIG. 8 illustrates forming metal interconnects 800 coupling to the NMOS transistors in accordance with the example embodiment. Metal interconnects 800 are formed to couple to the different terminals of the NMOS transistors. For example, metal interconnects 800 couple to the gate, drain, and source of the NMOS transistors. The formation of metal interconnects 800 is done by deposition of an interconnect metal layer using sputtering, e-beam evaporation, among other techniques and then patterned using lithography and etching which may be dry (Reactive ion etching) or wet (liquid or gas) or a combination of dry and wet. In addition, other techniques such as lift-off may be used for formation of metal interconnects 800. Metal used for formation of metal interconnects 800 may comprise of aluminum, aluminum/silicon, aluminum/silicon/copper, copper, including alloys of different metals. Other techniques of metal deposition and interconnect formation may include electrodeposition with CMP (Chemical Mechanical Polishing) utilizing dual damascene process technology. Multiple levels of metal interconnects may be used for the formation of various semiconductor devices such as Integrated Circuits.

Figure 9:
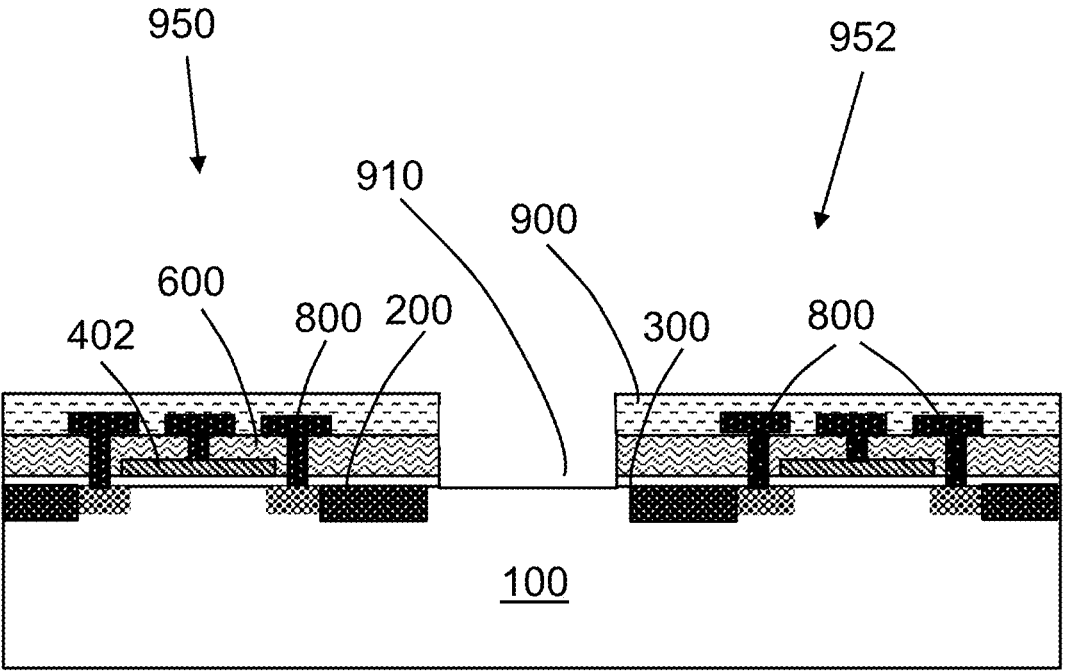
FIG. 9 is an illustration of a formation of a passivation layer and a dicing region between NMOS transistors formed in or on the semiconductor substrate in accordance with an example embodiment.

FIG. 9 illustrates formation of a passivation layer 900 and a dicing region 910 between NMOS transistors formed in or on semiconductor substrate 100 in accordance with an example embodiment. A NMOS transistor 950 and a NMOS transistor 952 each having a gate, drain, and source is separated by a dicing region 910. In the example, dicing region 910 is part of a dicing grid that is used to define individual die on semiconductor substrate 100 that will subsequently be separated. After formation of metal interconnects 800, a passivation layer 900 is deposited to protect the device and may be patterned in dicing region 910 between NMOS transistors 950 and 952 to facilitate formation of the semiconductor devices in subsequent process steps as will be described below.

Passivation layer 900 comprises materials that are compatible with metal interconnects 800 and deposited at a temperature so as not to affect the function or characteristics of the semiconductor devices. In one embodiment, passivation layer 900 overlying NMOS transistor 950 and NMOS transistor 952, comprises a PECVD (Plasma Enhanced Chemical Vapor Deposition) oxide and the thickness of the PECVD oxide may be in the range of (0.5-2) micrometers. Other materials used for passivation layer may comprise PSG (phosphor-silicate glass, BPSG (boro phosphosilicate glass), TEOS (tetra ethyl orthosilicate) among others.

Figure 10:
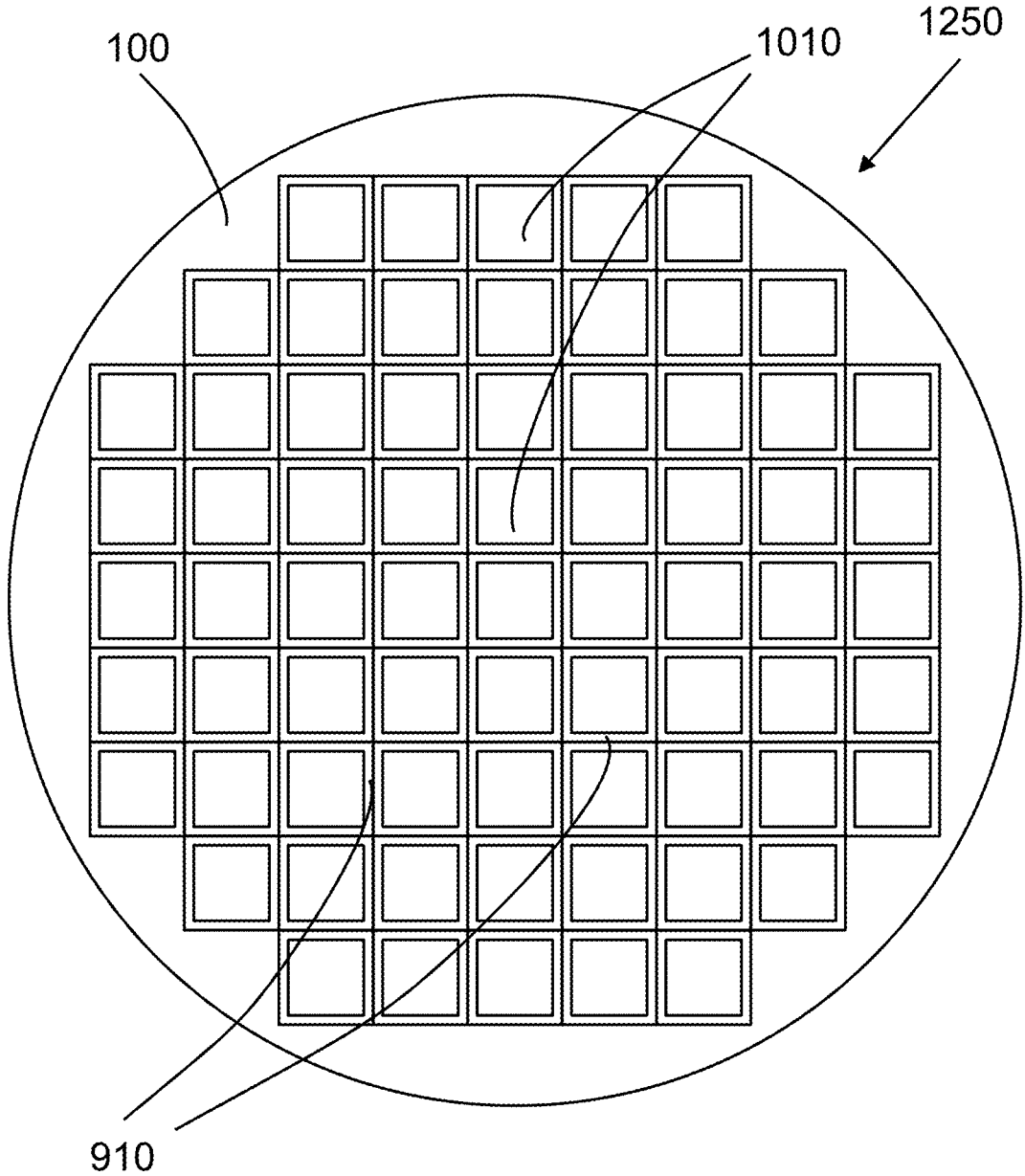
FIG. 10 is an illustration of a top view of semiconductor substrate 100 in accordance with an example embodiment.

FIG. 10 illustrates a top view of semiconductor substrate 100 in accordance with an example embodiment. FIGS. 1-9 were used to illustrate the fabrication steps for an example semiconductor device 1010 such as NMOS transistor 950 or NMOS transistor 952 of FIG. 9. In the example, each semiconductor device 1010 forms a die that will be separated from adjacent die. In the example, no devices are formed in dicing regions 910 and define where semiconductor substrate 100 can be severed, cut, or separated without impacting the functionality of the die. The entirety of dicing regions 910 on semiconductor substrate 100 comprises a dicing grid 1250 that identifies separated die formed on semiconductor substrate 100. As mentioned previously, each die can comprise a single device or an integrated circuit comprising a plurality of devices. The single device or the integrated circuit of a die resides within the area bounded by a periphery of dicing grids 910.

The method of separating individual die (singular) is called singulation and enables semiconductor devices which are formed using batch fabrication techniques to be separated into individual die. Dicing regions 910 in which the singulation process is used to separate the die from dicing grid 1250 comprises intersecting streets around the edges of each die. Dicing region 910 comprises portions of semiconductor substrate 100 that are singulated to separate each semiconductor device 1010. In the example embodiment, dicing regions 910 comprises horizontal and vertical regions called streets that intersect around each edge of semiconductor devices 1010. Since no devices are formed in dicing regions 910, it is important to minimize the size of the dicing grid while ensuring that the singulation process does not affect the yield, reliability or functionality of semiconductor devices 1010.

Figure 11:
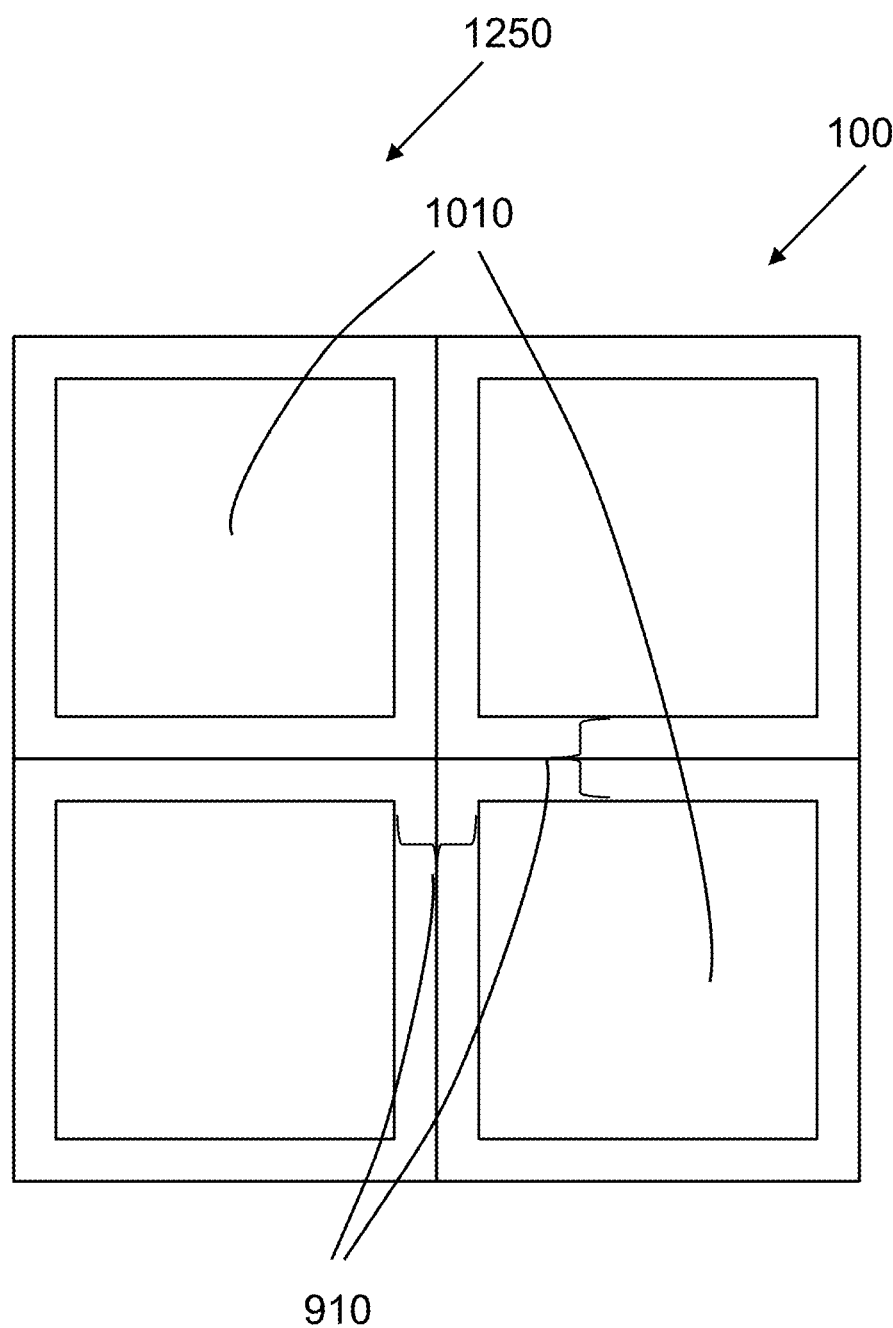
FIG. 11 is an exploded view of four semiconductor devices and the dicing regions for separating die in accordance with an example embodiment.

FIG. 11 is an exploded view of four semiconductor devices 1010 which are adjacent to each other on semiconductor substrate 100 and separated by dicing regions 910 in accordance with an example embodiment. In the example embodiment, semiconductor devices 1010 are shown to be square in shape and dicing regions 910 are configured to bound each die. In other embodiments, semiconductor devices 1010 may comprise shapes such as square, rectangular, linear, elongated, triangular, rhomboid, or hexagonal among other shapes. The size of semiconductor devices 1010 may be few hundred microns in side length to multiples of centimeters in side length. Semiconductor devices 1010 may be discrete devices, integrated circuits, hybrid integrated devices, among others. The width of dicing region 910 may vary between few micrometers to hundreds of micrometers. In an example embodiment, a width of dicing regions 910 is 100 micrometers.

Figure 12:
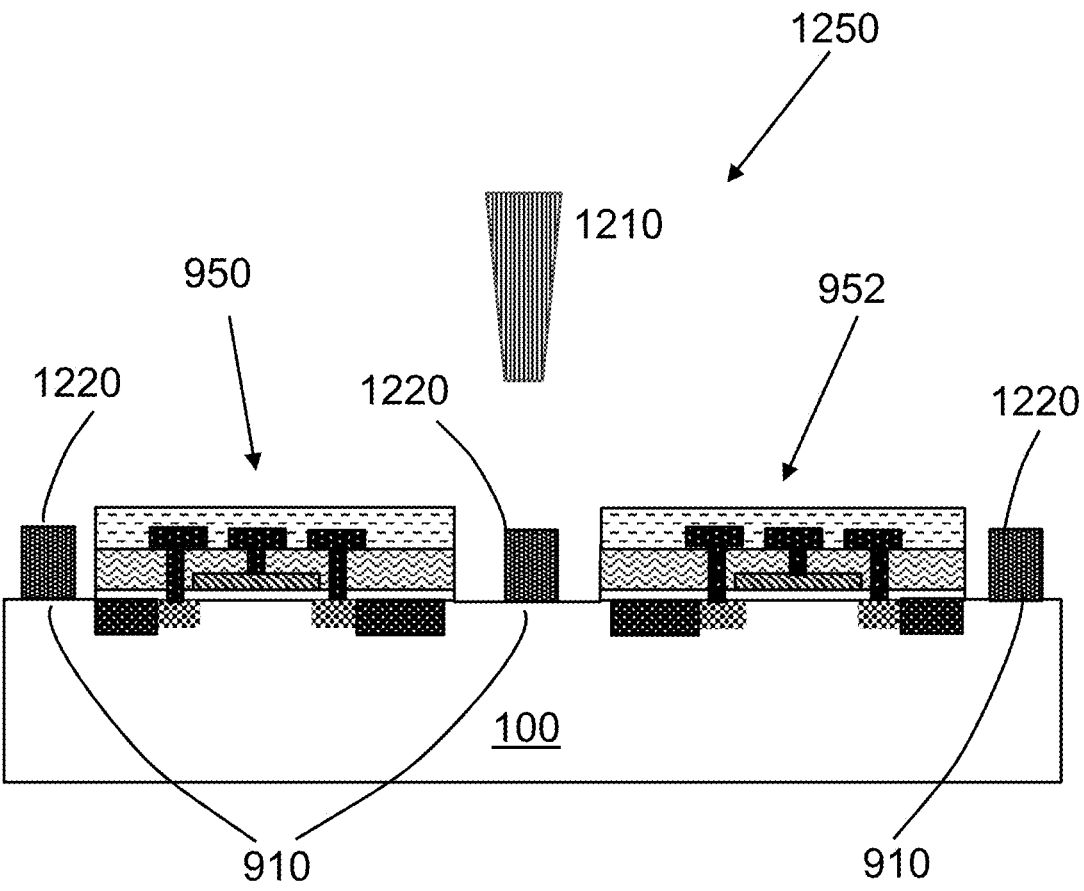
FIG. 12 is an illustration of a plurality of die comprising of semiconductor devices and a dicing grid with a layer of carbon overlying the dicing grid in accordance with an example embodiment.

FIG. 12 illustrates a plurality of die and a dicing grid 1250 with carbon 1220 overlying a dicing grid 1250 in accordance with an example embodiment. The example embodiment uses a method of singulation of semiconductor substrate 100 with significant advantages compared to prior art techniques currently used in the semiconductor industry. In the example embodiment, NMOS transistors 950 and 952 each represent die that is separated by dicing regions 910 on the semiconductor substrate 100. In the example, dicing grid 1250 is an area between die that supports singulation of the die using a technique described in subsequent steps herein below. Ideally, the technique minimizes the area between the die to increase the number of die that can be placed on semiconductor substrate 100. The technique used for dicing will also reduce defectivity in the dicing grid that can propagate to a die area thereby reducing yield of good die. In the example embodiment, carbon 1220 is deposited overlying a surface of the semiconductor substrate 100 within dicing grid 1250. In one embodiment, carbon 1220 has a width less than the width of dicing regions 910. In one embodiment dicing grid 1250 comprises dicing regions 910 forming a grid such that square die as shown in FIG. 11 are formed bounded by dicing regions 910. In one embodiment, an inkjet head 1210 is scanned to deposit carbon 1220 across the surface of dicing regions 910 between and around NMOS transistor 950 and NMOS transistor 952. The width, height and placement of carbon 1220 overlying dicing grid 1250 is controlled by design and movement of inkjet head 1210.

Figure 13:
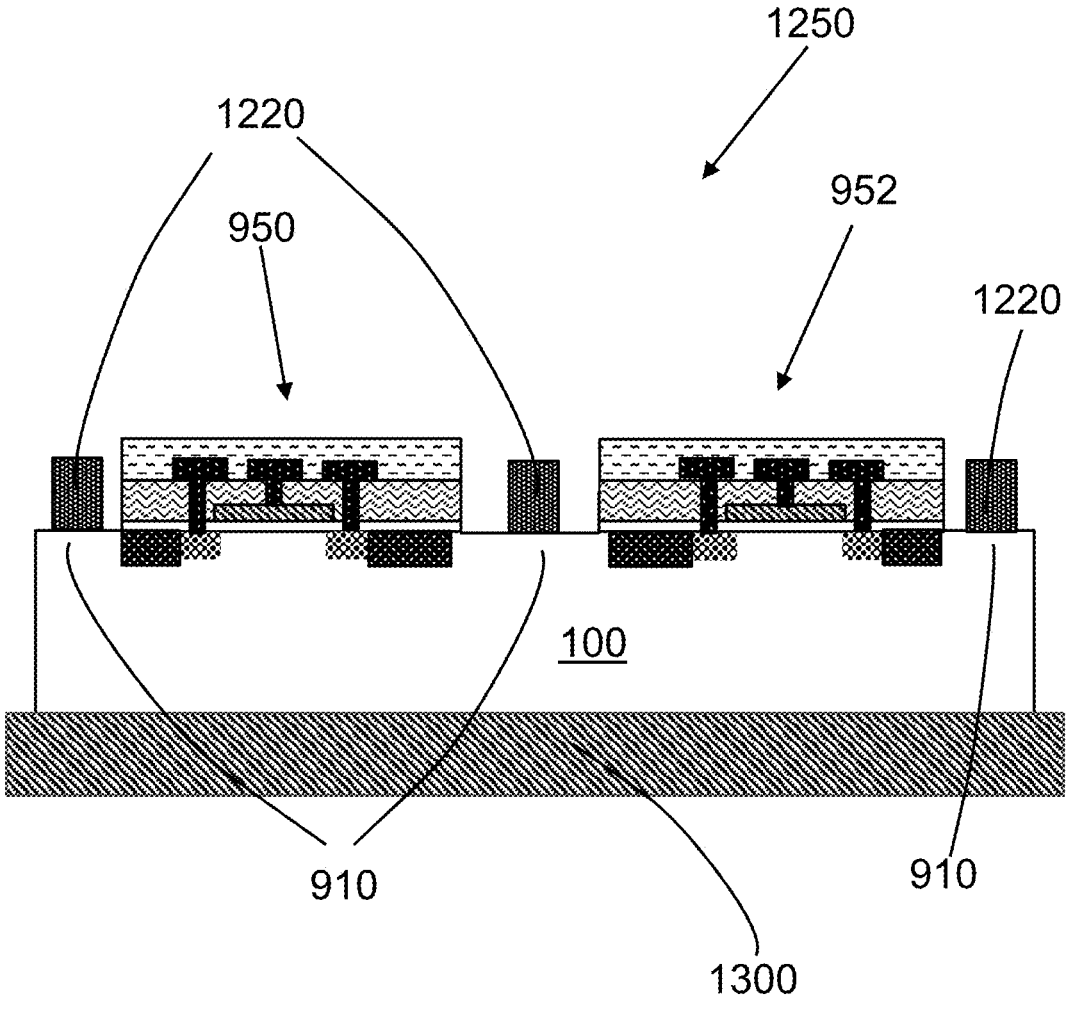
FIG. 13 is an illustration of the plurality of die comprising one or more semiconductor devices in the semiconductor substrate with the carbon overlying the dicing regions and mounted on a dicing tape in accordance with an example embodiment.

FIG. 13 illustrates the plurality of die comprising one or more semiconductor devices in semiconductor substrate 100 with carbon 1220 overlying dicing regions 910 and mounted on a dicing tape 1300 in accordance with an example embodiment. In the example embodiment, the plurality of die respectively comprise NMOS transistor 950 and NMOS transistor 952. As previously discussed in FIG. 12, carbon 1220 is deposited by inkjet head 1210 overlying dicing regions 910 of dicing grid 1250 on semiconductor substrate 100. In one embodiment, dicing tape includes a dicing ring. The attachment of the assembly to semiconductor substrate 100 including NMOS transistor 950 and NMOS transistor 952 to dicing tape 1300 makes it ready for the singulation process that is subsequently performed.

Figure 14:
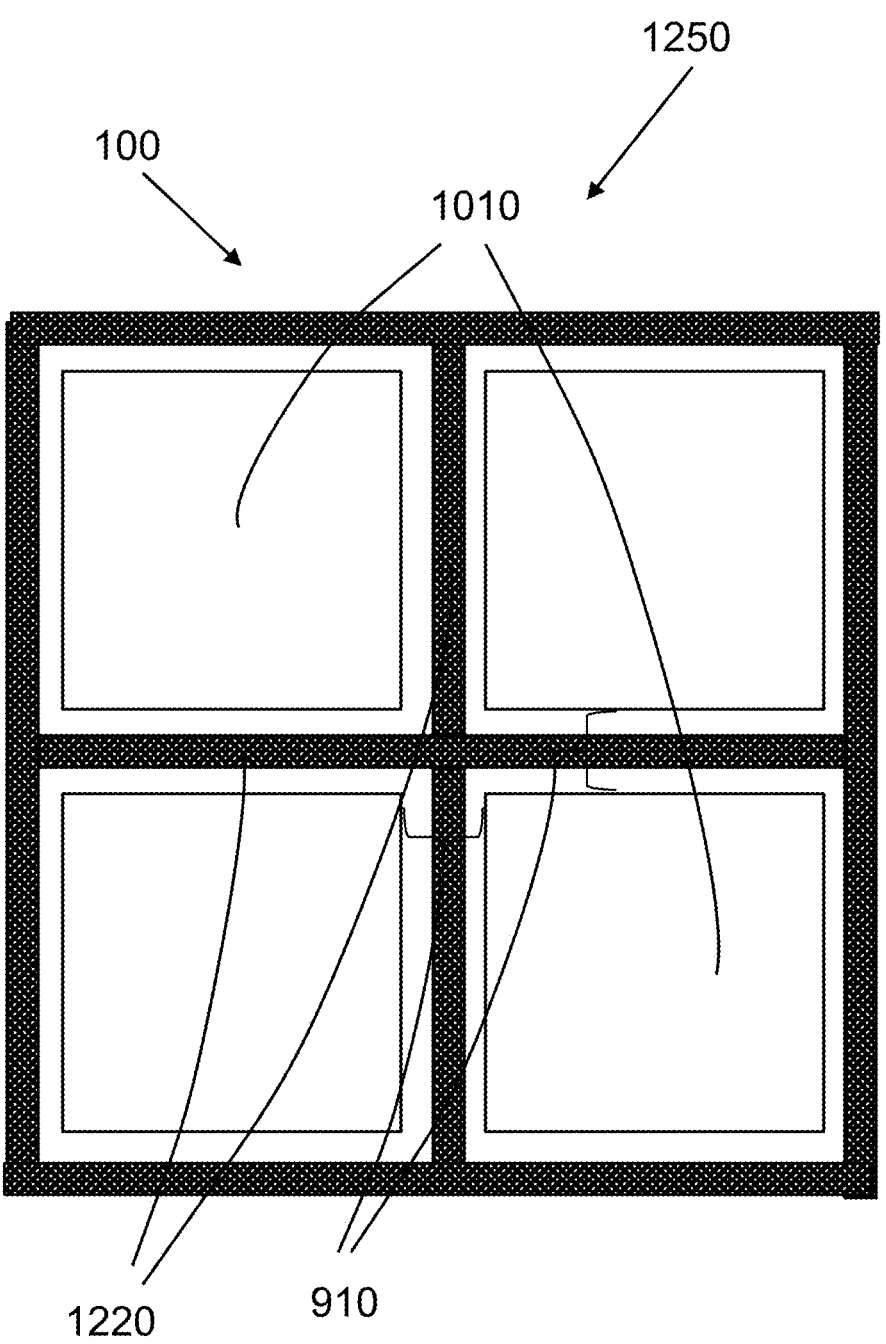
FIG. 14 is an illustration of a top view of the semiconductor substrate showing four die comprising one or more semiconductor devices having the carbon overlying the dicing grid accordance with an example embodiment.

FIG. 14 illustrates a top view of semiconductor substrate 100 showing four die each comprising one or more semiconductor devices having carbon 1220 overlying dicing grid 1250 in accordance with an example embodiment. Plurality of die of semiconductor devices 1010 which are adjacent to each other and separated by dicing regions 910 form part of dicing grid 1250 configured to separate die of semiconductor substrate 100. In the example embodiment, die 1010 is shown to be square in shape and dicing regions 910 bound die of semiconductor devices 1010 in a square shape. The width of carbon 1220 overlying dicing regions 910 is determined by the dispense pattern and nozzle diameter of inkjet head 1210 of FIG. 12 and is less than or equal to the width of dicing region 910. In one embodiment, a thickness of carbon 1220 in dicing grid 1250 is determined by the program used by inkjet head 1210 and its design.

Figure 15:
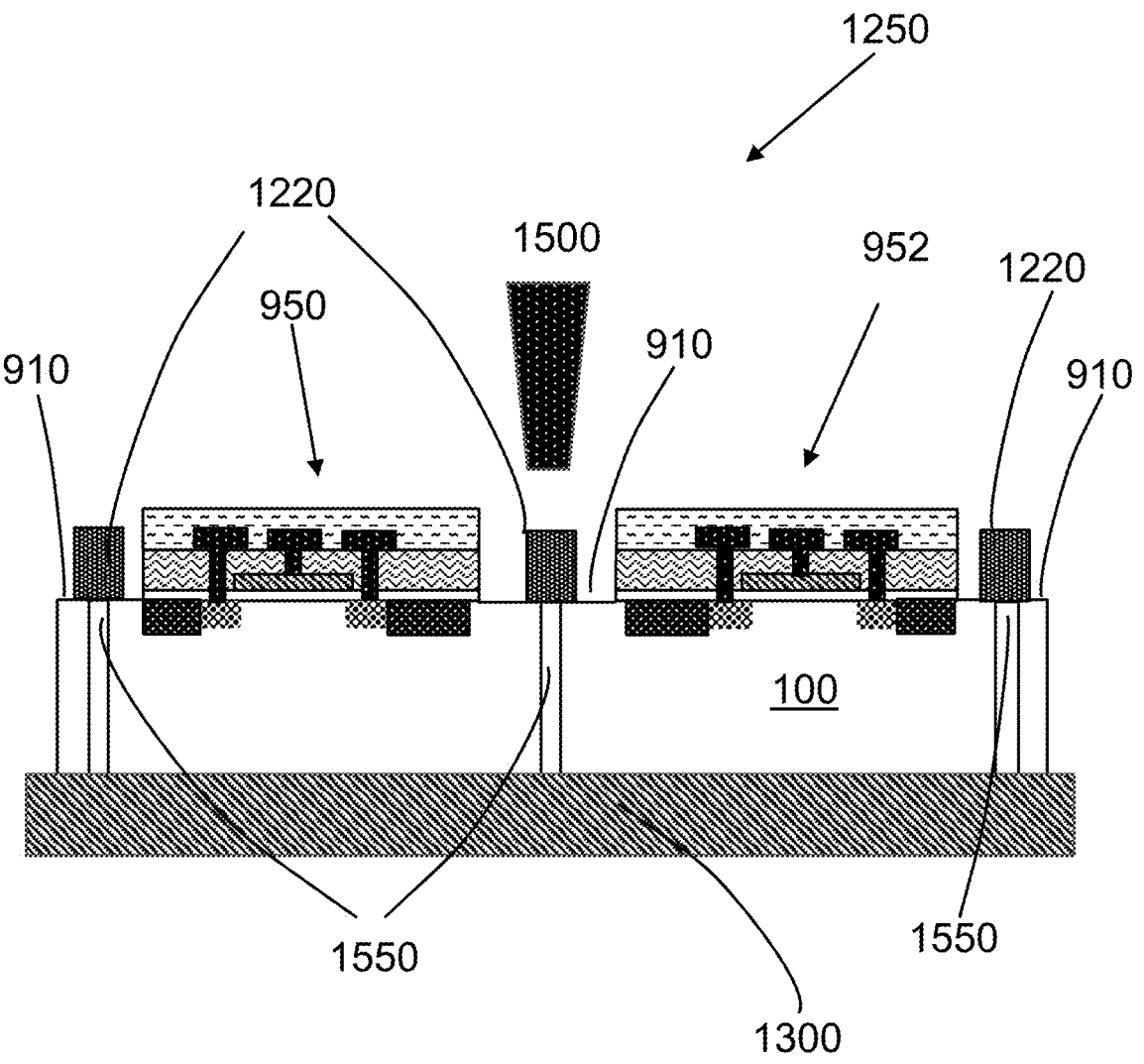
FIG. 15 illustrates the singulation of the plurality of die on or in semiconductor substrate using a laser to couple energy to carbon overlying dicing grid in accordance with an example embodiment.

FIG. 15 Illustrates singulation of the plurality of die on or in semiconductor substrate 100 using a laser 1500 to couple energy to carbon 1220 overlying dicing grid 1250 in accordance with an example embodiment. In the example embodiment, carbon 1220 in dicing grid 1250 is selectively heated to high temperatures in a very short time to heat carbon 1220 on dicing grid 1250 such that heat from carbon causes vertical fractures 1550 beneath carbon 1220 I in substrate 100. In the example embodiment, the temperature is greater than 4000K. As stated, the material overlying dicing regions 910 is carbon 1220 but can be other materials that can be heated rapidly to high temperatures. Laser 1500 is chosen to have a wavelength to selectively couple energy to carbon 1220 or the material of choice overlying dicing grid 1250 to produce vertical fracture 1550 in semiconductor substrate 100 within dicing regions 910. Note that although only a small portion of semiconductor substrate 100 is shown, it is understood that a dicing process occurs to separate all die on semiconductor substrate 100.

Laser 1500 is continuously operated or in a pulsed mode where the pulse width, pulse amplitude, pulse duration, duty cycle is modulated to cause selective coupling with carbon 1220 overlying dicing grid 1250. In one embodiment, the spot size of laser 1500 is in the range of 10-100 micrometers in diameter. In one embodiment, the material overlying dicing grid 1250 is composed of carbon or a material that is converted to carbon prior to or during the use of laser 1500. The choice of wavelength of laser 1500 determines the choice of materials deposited overlying dicing grid 1250 of semiconductor substrate 100. A thermal shock induced by laser 1500 heating carbon 1220 causes singulation of die by vertical fractures 1550 in semiconductor substrate beneath carbon 1220 overlying dicing grid 1250. The thermal shock produced by heating carbon 1220 overlying dicing grid 1250 occurs in less than 50 nanoseconds thereby producing fractures in semiconductor substrate underlying carbon 1220.

In an example embodiment, laser 1500 has a wavelength of 1065 nm and has a spot size of 35 micrometers with a peak power of 16000 watts, and is used in pulse mode with a pulse width of approximately 50 nSec. Laser 1500 heats carbon 1220 overlying dicing grid 1250 to approximately 4000K to produce the thermal shock that produces vertical fractures in semiconductor substrate 100 within dicing regions 910. Although vertical fractures 1550 in semiconductor substrate 100 separate NMOS transistor 950 from NMOS transistor 952, the die are held in place by dicing tape 1300.

In an alternate embodiment, laser 1500 is configured to heat carbon 1220 overlying dicing grid 1250 to produce a temperature differential of 3000K in semiconductor substrate 100 to produce the thermal shock to cause vertical fractures in dicing regions 910 of semiconductor substrate 100.

Figure 16:
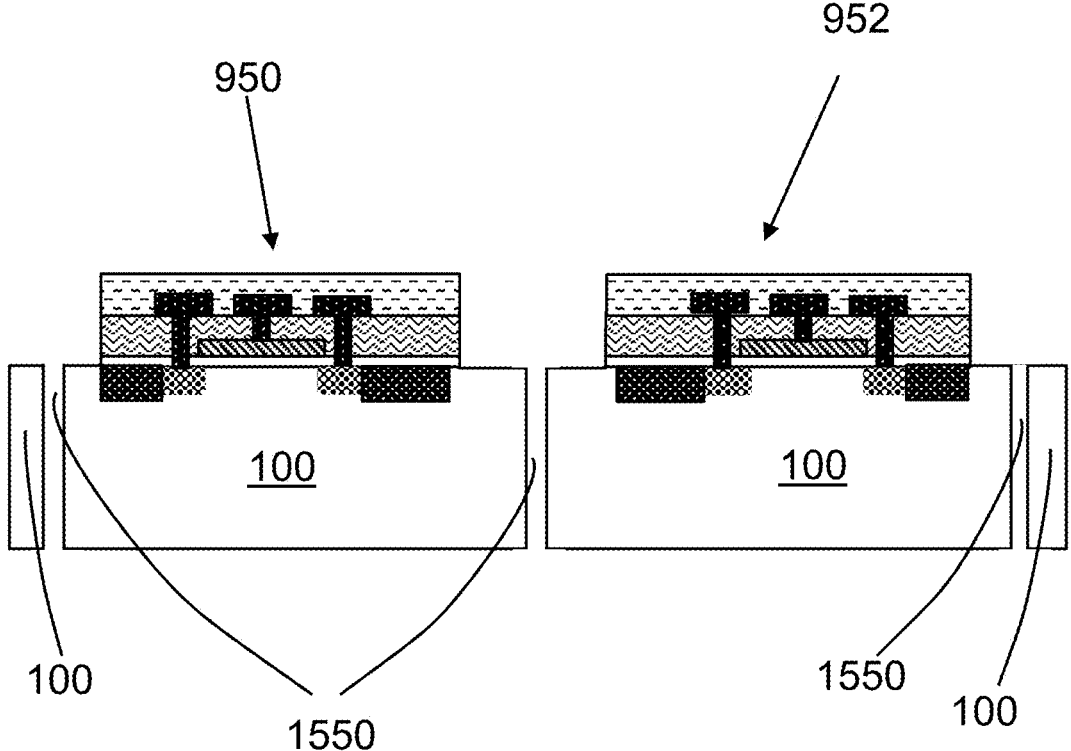
FIG. 16 is an illustration of the plurality of die singulated by vertical fractures using a laser to couple energy to heat the carbon in accordance with an example embodiment.

FIG. 16 is an illustration of singulated die in accordance with an example embodiment. In the example embodiment, NMOS transistor 950 and NMOS transistor 952 are singulated from one another by vertical fractures 1550 through semiconductor substrate 100. As disclosed previously, vertical fractures 1550 are produced after laser 1500 couples energy to carbon 1220 of FIG. 14 to produce thermal stress in dicing grid 1250. In the example embodiment, singulated die corresponding to NMOS transistor 950 and NMOS transistor 952 are separated from dicing tape 1300 and are ready for further processing. In one embodiment, each die singulated from semiconductor substrate 100 by heating carbon 1220 may be assembled in packages for various applications using processes such as die attach, wirebond and other assembly processes.

Figure 17:
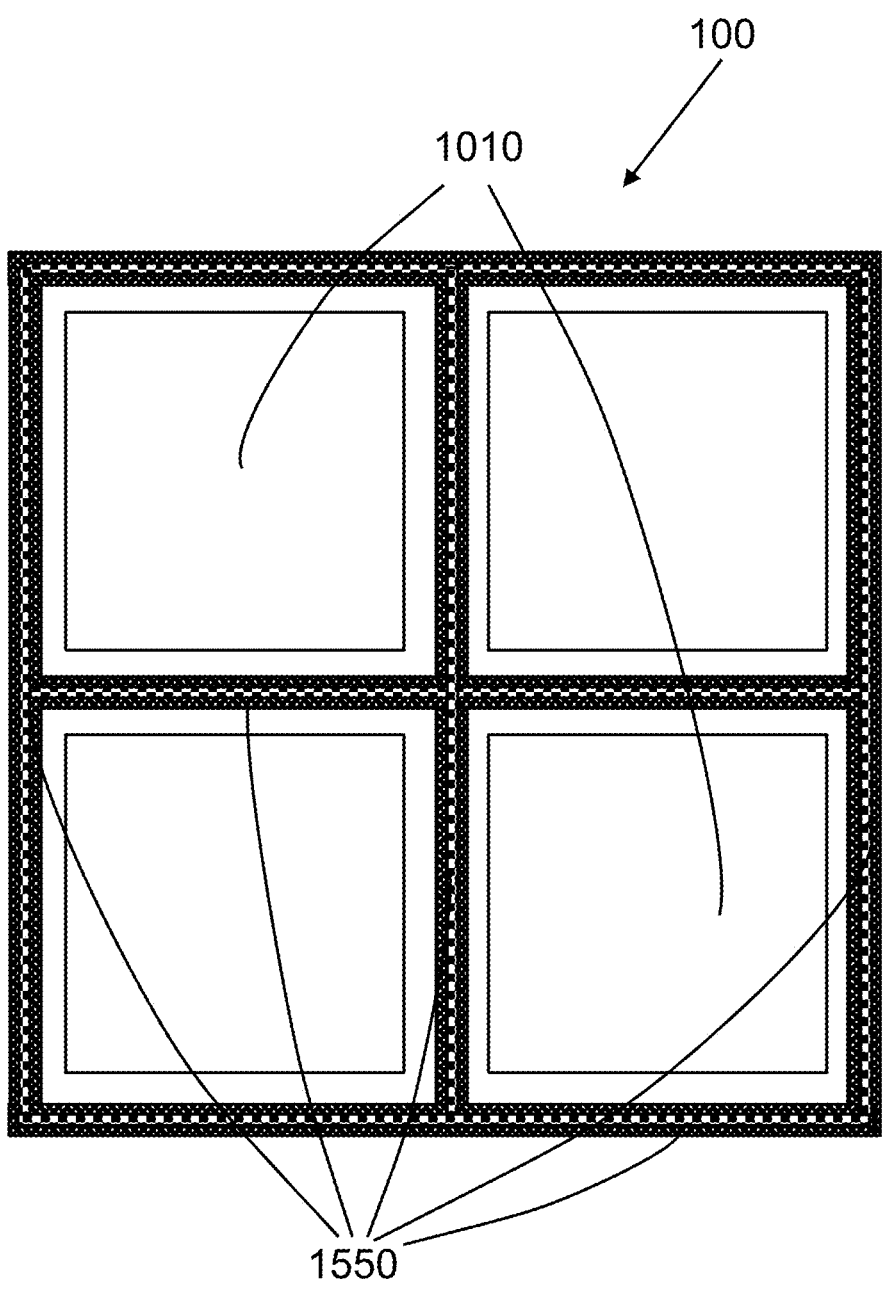
FIG. 17 is an illustration of a top view of the plurality of die singulated in accordance with an example embodiment.

FIG. 17 is an illustration of a top view of the plurality of die singulated in accordance with an example embodiment. In the example embodiment, a width of vertical fracture 1550 is less than a width of dicing regions 910 of FIG. 15. In one embodiment, semiconductor devices 1010 are NMOS transistors. Vertical fractures 1550 couple from a top surface of semiconductor substrate 100 to a bottom surface of semiconductor substrate 100 thereby separating semiconductor devices 1010 from one another. As disclosed herein, vertical fractures 1550 are produced by coupling energy by using laser 1500 of FIG. 15 to heat carbon 1220 overlying dicing region 910 of semiconductor substrate 100.

Figure 18:
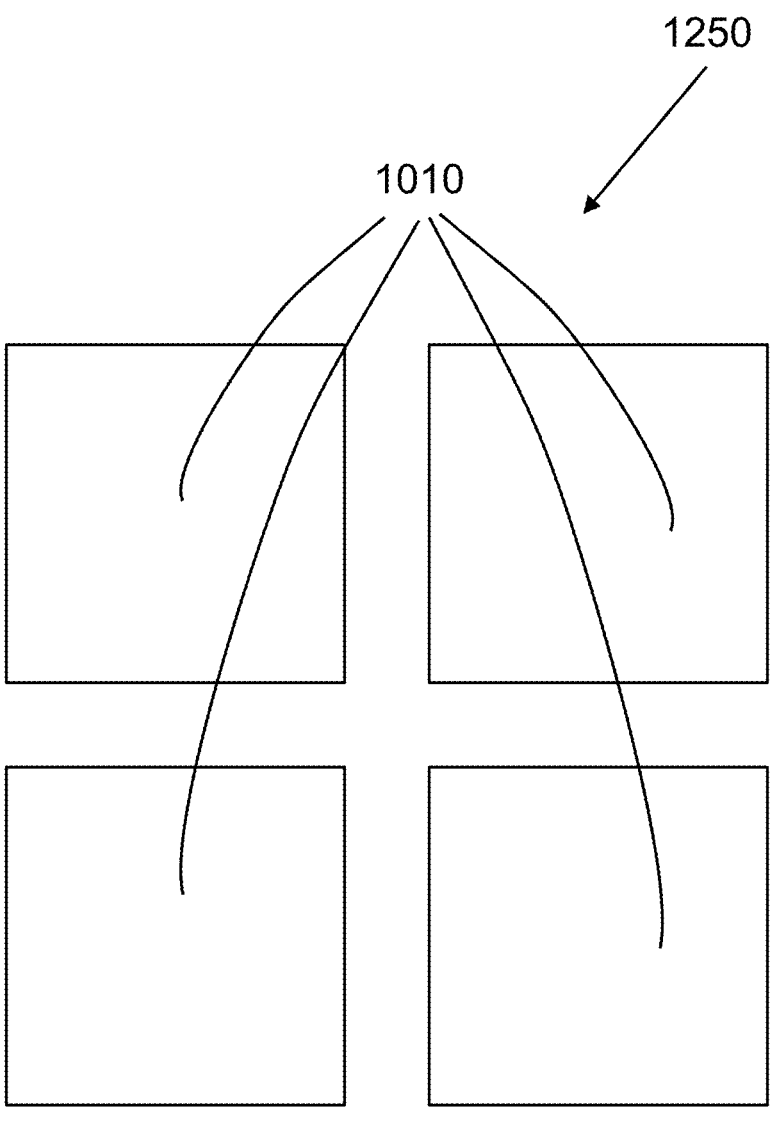
FIG. 18 is an illustration of the semiconductor devices that have been singulated or separated from one another in accordance with an example embodiment.

FIG. 18 is an illustration of separated semiconductor devices 1010 in accordance with an example embodiment. In the example, semiconductor devices 1010 are NMOS transistors. As previously disclosed semiconductor devices 1010 can be a single device, multiple devices, integrated circuits, micro-electromechanical structures, or other devices that can be formed on a semiconductor substrate. In one embodiment, semiconductor devices 1010 are available for assembly in packages for various applications using processes such as die attach, wirebond and other assembly processes.

Figure 19:
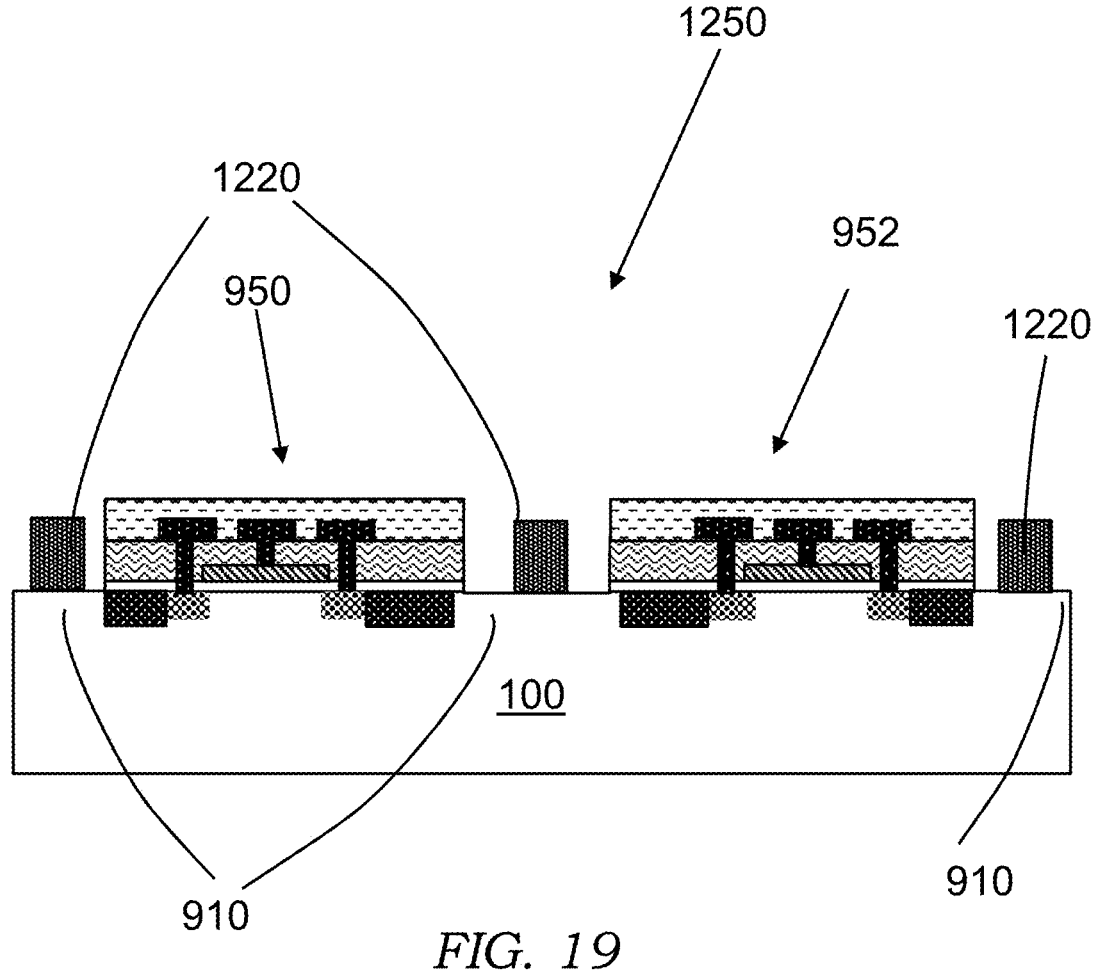
FIG. 19 is an illustration of the plurality of die configured for singulation in accordance with an example embodiment.

FIG. 19 is an illustration of the plurality of die configured for singulation in accordance with an example embodiment. In the example NMOS transistor 950 and NMOS transistor 952 are configured to be singulated from one another as part of a singulation process for all die on semiconductor substrate 100. Dicing grid 1250 comprises dicing regions 910 having a deposited carbon layer using sputtering and then using lithography and RIE (Reactive Ion Etching) to remove the carbon layer from other portions of surface of semiconductor substrate 100 in areas overlying portions of dicing regions 910 of dicing grid 1250. In the example embodiment, after deposition of the carbon layer and patterning of the carbon layer, carbon 1220 remains overlying dicing regions 910. The thickness of sputtered carbon layer as well as width of dicing grid 1250 is determined by the energy requirement to cause vertical fracture of semiconductor substrate 100 when carbon 1220 is heated by a laser disclosed herein die of semiconductor substrate 100.

Figure 20:
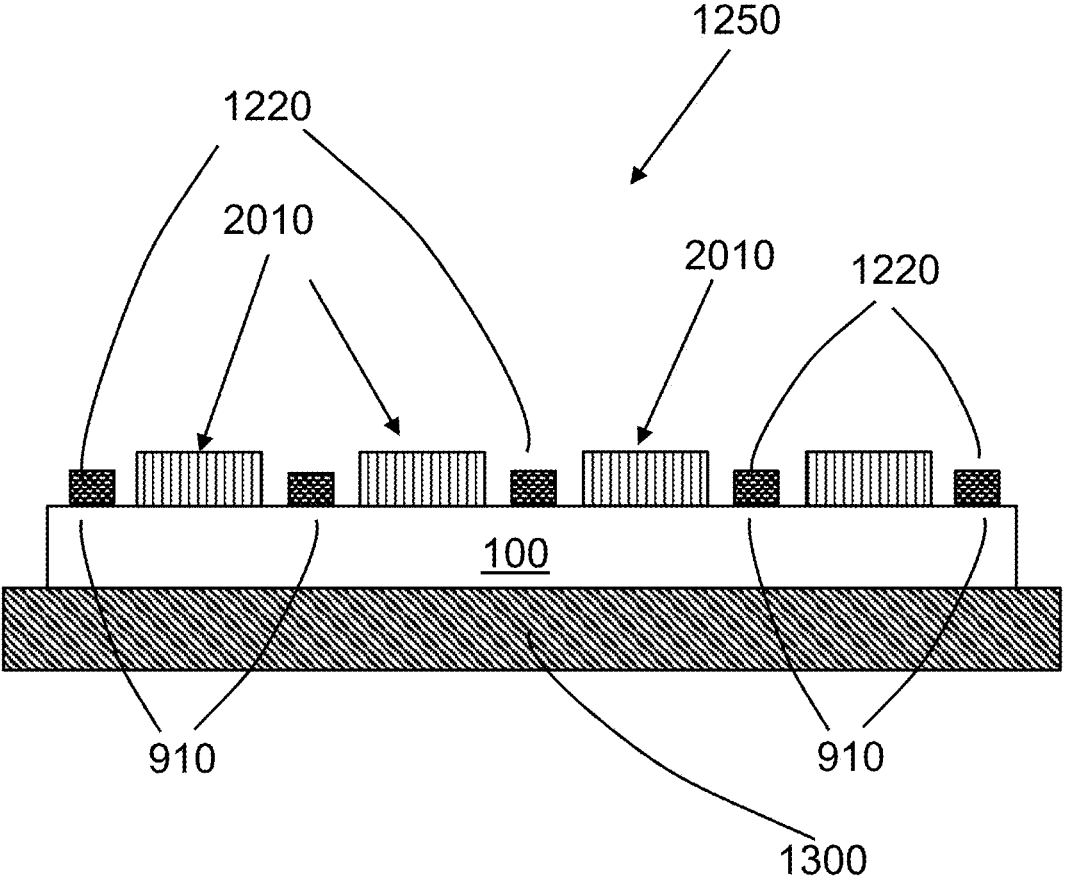
FIG. 20 is an illustration of semiconductor substrate having the carbon deposited by a process of sputtering in accordance with an example embodiment.

FIG. 20 is an illustration of semiconductor substrate 100 having carbon 1220 deposited by a process of sputtering in accordance with an example embodiment. In the example, semiconductor substrate 100 has a plurality of die 2010 formed on or in semiconductor substrate 100. A dicing grid 1250 comprising dicing regions 910 separate plurality of die 2010 from one another. A process of sputtering is used to deposit carbon 1220 overlying dicing regions 910. In the example embodiment, carbon 1220 is sputtered having a width less than the width of dicing regions 910. Plurality of die 2010 formed on or in semiconductor substrate 100 is mounted on dicing tape 1300 prior to singulation. Semiconductor die 2010 may be formed of discrete and integrated circuits and may comprise power, analog, digital, RF (Radio Frequency), photonics, memory, sensors, among other devices. Semiconductor substrate 100 may be silicon, silicon carbide, gallium arsenide, gallium nitride, indium phosphide, SOI (silicon on insulator) among other materials.

Figure 21:
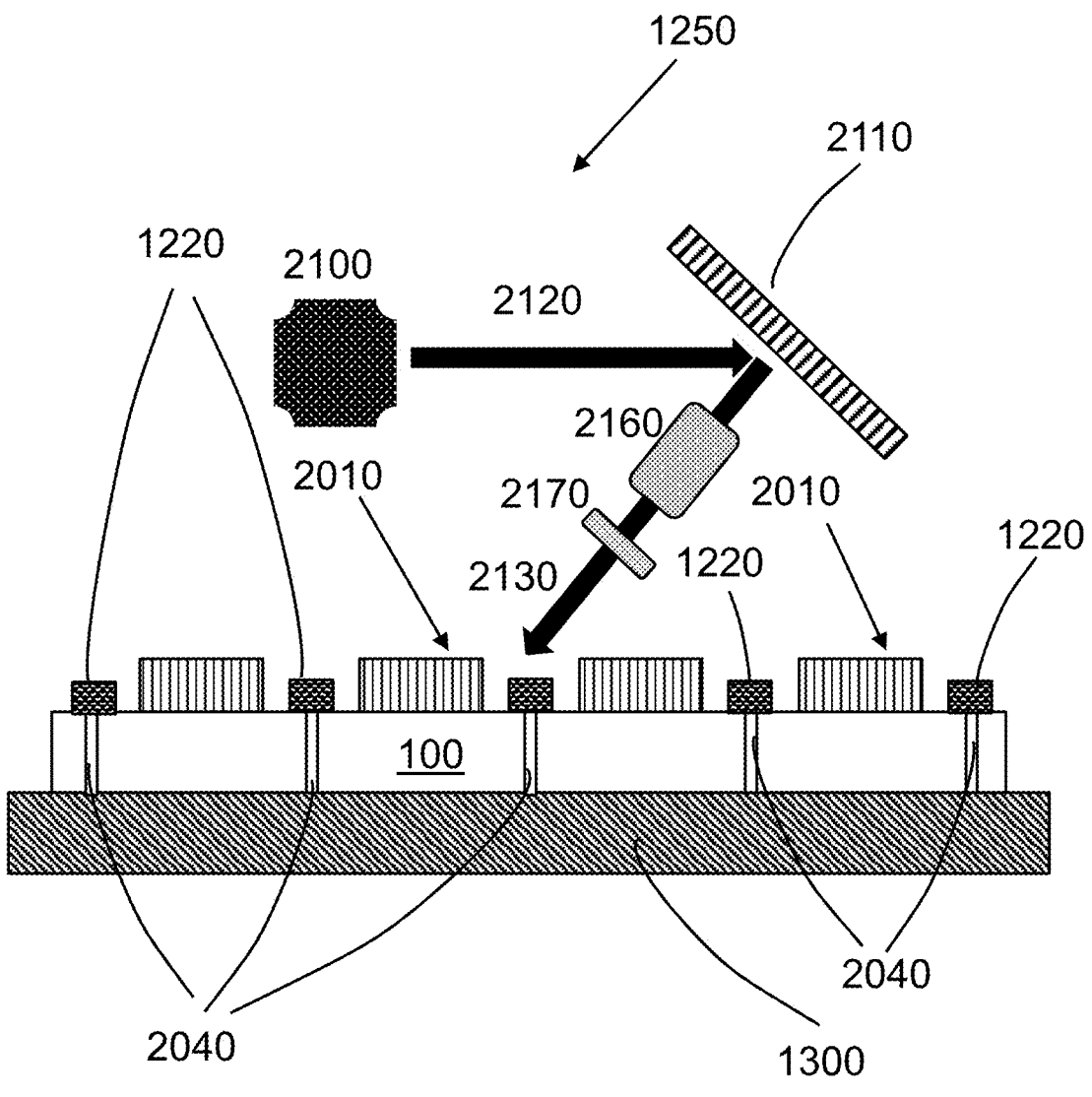
FIG. 21 is an illustration of a laser source used with a scanning mirror to couple energy to the carbon overlying the dicing grid in accordance with an example embodiment.

FIG. 21 is an illustration of a laser source 2100 used with a scanning mirror 2110 to couple energy to carbon 1220 overlying dicing grid 1250 in accordance with an example embodiment. A partial view of semiconductor substrate 100 is shown on dicing tape 1300. Die 2010 are formed on or in semiconductor substrate 100 and are configured to be separated or singulated from one another. Note that the dicing process disclosed herein is configured to singulate all die 2010 on semiconductor substrate 100. Each die can comprise one or more devices, one or more circuits, one or more electromechanical structures, or one or more interconnects. The energy coupled by laser source 2100 selectively heats carbon 1220 overlying dicing grid 1250 such that the heat produces a thermal shock that creates a vertical fracture 2040 beneath carbon 1220 in semiconductor substrate 100 and separates semiconductor die 2010 while still be attached to dicing tape 1300. The thermal shock is due to the heat generated by carbon 1220 from energy delivered by laser source 2100 or the temperature differential between carbon 1220 and semiconductor substrate 100. The wavelength of laser light used in laser source 2100 is determined by the material used in dicing grid 1250 and the material used for semiconductor substrate 100. Laser source 2100 may be operated in continuous mode or in pulsed mode, depending on the requirements of the singulation process. The incident laser beam 2120 is reflected by scanning mirror 2110 and then passes through a collimating system 2160 and a focusing lens 2170 such that the reflected laser beam 2130 couples energy to carbon 1220 overlying dicing grid 1250. The scan rate and direction may be controlled by a computer such that the energy required to couple with carbon 1220 overlying dicing grid 1250 is sufficient to cause vertical fractures 2040 enabling singulation of die 2010. In another embodiment using a galvo scanner, a focusing lens is used to focus the laser beam before it impinges on the semiconductor substrate.

Figure 22:
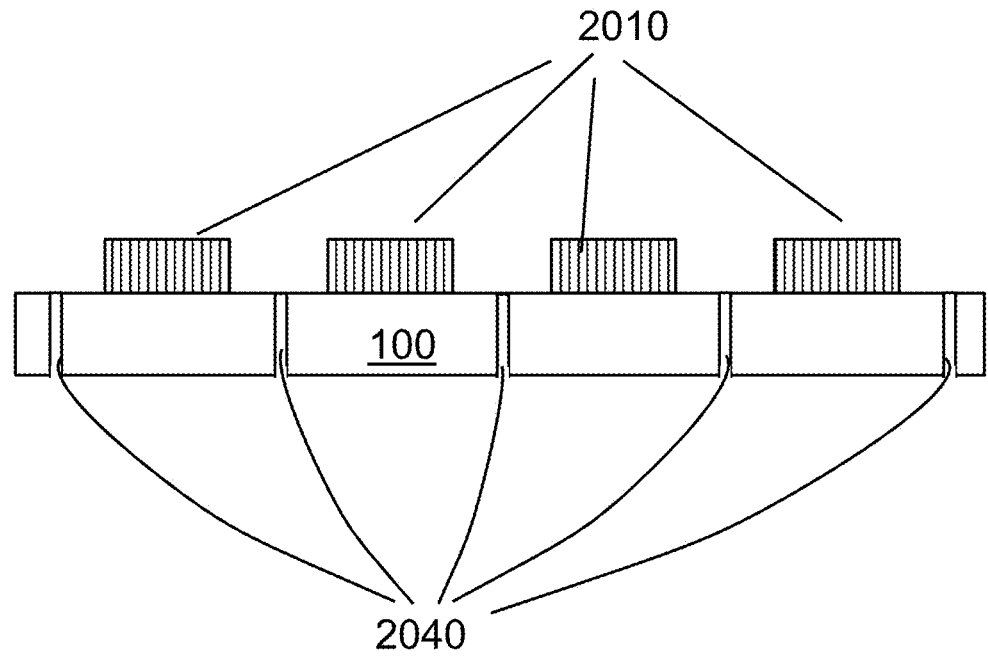
FIG. 22 is an illustration of die singulated in accordance with an example embodiment.

FIG. 22 is an illustration of die 2010 singulated in accordance with an example embodiment. Laser beam 2120 from laser 2100 is reflected by scanning mirror 2110 such that reflected laser beam 2130 of FIG. 21 creates the thermal shock to create vertical fractures 2040 beneath dicing grid 1250. As shown, the four die 2010 are singulated from one another by vertical fractures 2040. Dicing tape 1300 of FIG. 3 has been removed to support handling of die 2010 from semiconductor substrate 100.

Figure 23:
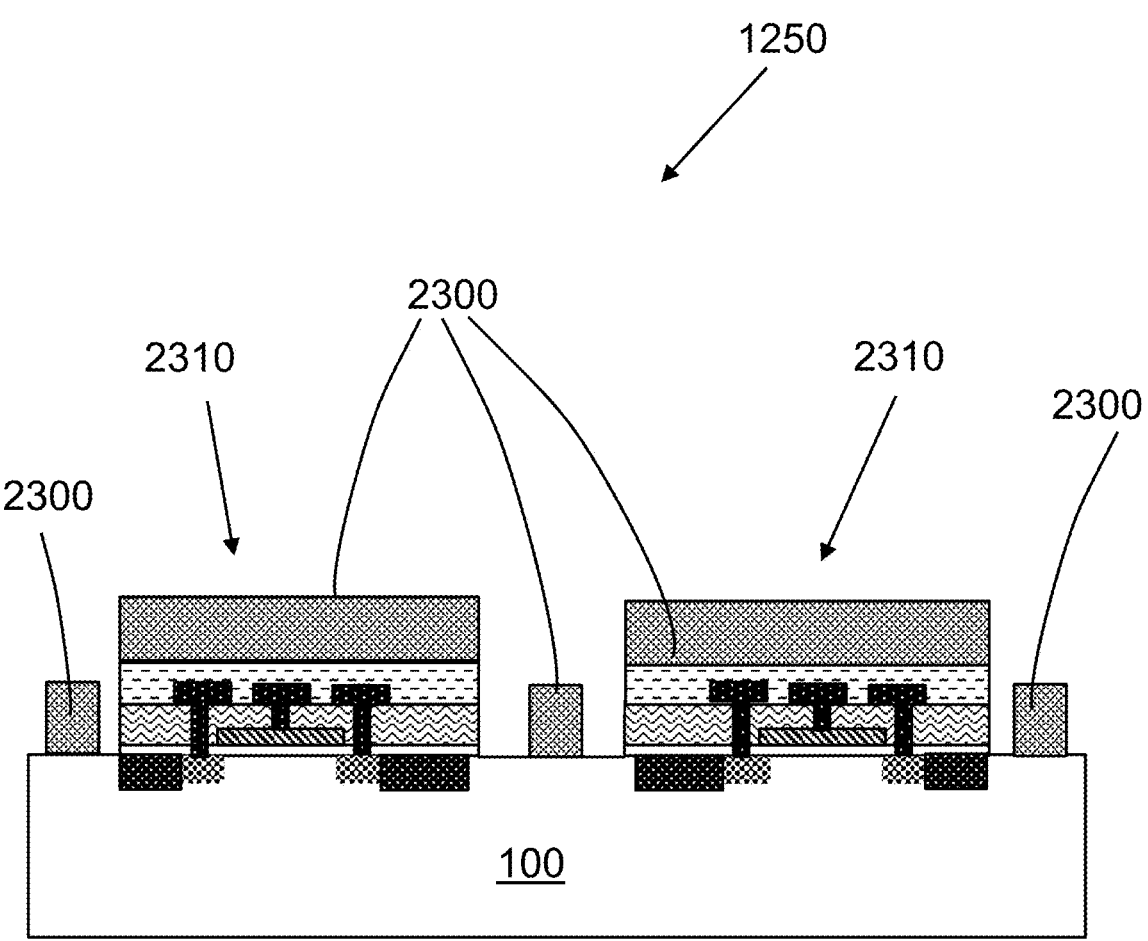
FIG. 23 is an illustration of a polymer layer of polyimide deposited and patterned over a plurality of semiconductor die formed in semiconductor substrate in accordance with an example embodiment

FIG. 23 is an illustration of a polymer layer 2300 of polyimide deposited and patterned over a plurality of semiconductor die 2310 formed in semiconductor substrate 100 in accordance with an example embodiment. FIG. 23 is a partial view of semiconductor substrate 100 showing plurality of die 2310. Plurality of die 2310 is formed on or in the entire semiconductor substrate 100. Each die of plurality of die 2310 can comprise a device or devices, a circuit or circuits, or electro-mechanical structure, or other structures that can be formed on or in semiconductor substrate 100. In many semiconductor devices, a protective layer of a polymer is deposited to protect a surface of each completed semiconductor device formed on semiconductor substrate 100. In the example, the polymer is polyimide. The polyimide layer is typically spin coated and then patterned using lithography and etching. If a photosensitive polyimide is used, it is patterned using a mask with lithographic techniques. If a non-photosensitive polyimide is used, it is patterned using a mask with lithographic techniques followed by etching using RIE (Reactive Ion Etching). In the example embodiment, patterned polymer layer 2300 of polyimide is formed overlying semiconductor die 2310 and in dicing grid 1250 between adjacent die of plurality of die 2310. In one embodiment, polymer layer 2300 has a width less than or equal to dicing grid 1250 that is between plurality of die 2310 of semiconductor substrate 100.

Figure 24:
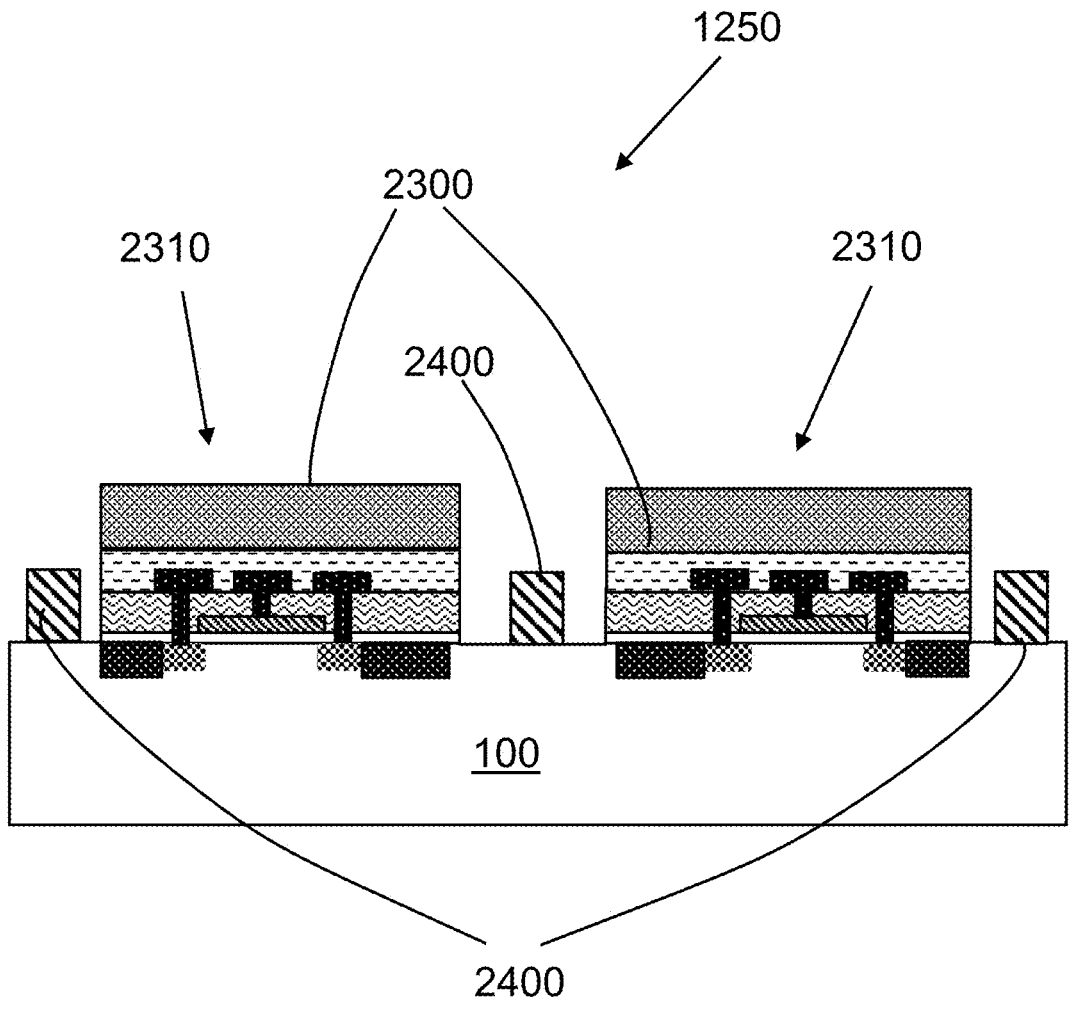
FIG. 24 is an illustration of dicing grid bounding plurality of die in accordance with an example embodiment.

FIG. 24 is an illustration of dicing grid 1250 bounding plurality of die 2310 in accordance with an example embodiment. FIG. 23 discloses a polymer layer 2300 such as polyimide overlying dicing grid 1250 of semiconductor substrate 100. In one embodiment, polymer layer 2300 is converted into carbon by pyrolysis. In the example, carbon 2400 converted from polyimide by pyrolysis overlies dicing grid 1250. In one embodiment, the width of carbon 2400 is less or equal to the width of dicing grid 1250. Polymer layer 2300 overlying dicing grid 1250 can be converted to carbon by other means known to one skilled in the art.

In an example embodiment, polymer layer 2300 is patterned using standard semiconductor processes to place polyimide overlying dicing grid 1250 and then the polyimide is carbonized by using a laser to selectively heat up polymer layer 2300 above 800 C in an inert environment such as nitrogen. Carbon 2400 is formed by the local pyrolysis of the patterned polyimide from FIG. 23. In one embodiment, dicing grid 1250 uses a laser having different properties that selectively couples energy to carbon 2400 that produces heat that produces vertical fractures in semiconductor substrate 100 to singulate plurality of die 2310 from each other. In one embodiment, the singulation occurs over the entire semiconductor substrate 100 to singulate all die. In one embodiment, the vertical fractures occur underlying carbon 2300 and within dicing grid 1250. In an example embodiment, two lasers are used to couple energy to carbon 2400 in dicing with two different wavelengths. In one embodiment, a first laser is used to couple energy to selectively convert polymer layer 2300 into a carbon layer and a second laser is used to singulate semiconductor substrate 100 by producing a thermal shock that creates vertical fractures below dicing grid 1250.

Figure 25:
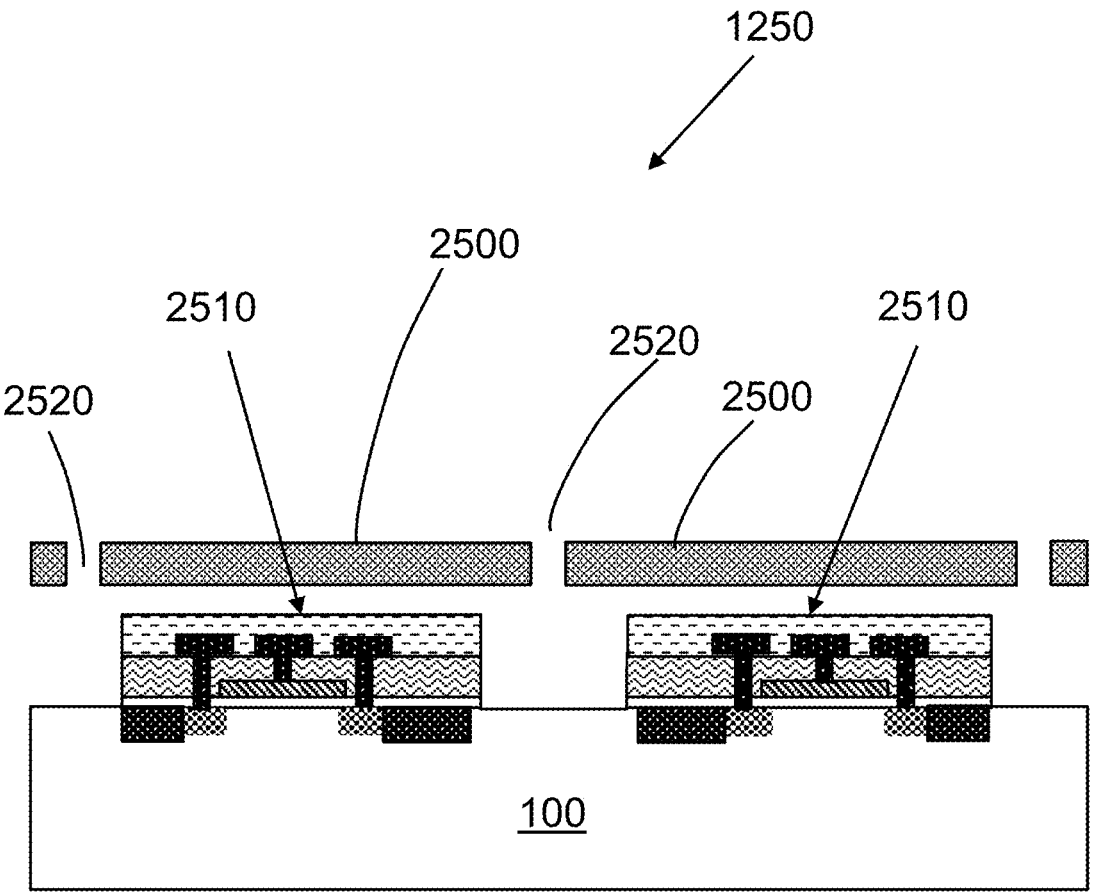
FIG. 25 is an illustration of a stencil mask and a plurality of openings overlying a portion of semiconductor substrate in accordance with an example embodiment.

FIG. 25 is an illustration of a stencil mask 2500 and a plurality of openings 2520 overlying a portion of semiconductor substrate 100 in accordance with an example embodiment. In one embodiment, plurality of openings 2520 are formed overlying dicing grid 1250. Stencil mask 2500 masks areas other than dicing grid 1250 that bounds a plurality of die 2510. In one embodiment, a size of plurality of openings 2520 in stencil mask 2550 is configured to determine a width of dicing grid 1250 in semiconductor substrate 100 that are exposed after a formation of plurality of die 2510.

Figure 26:
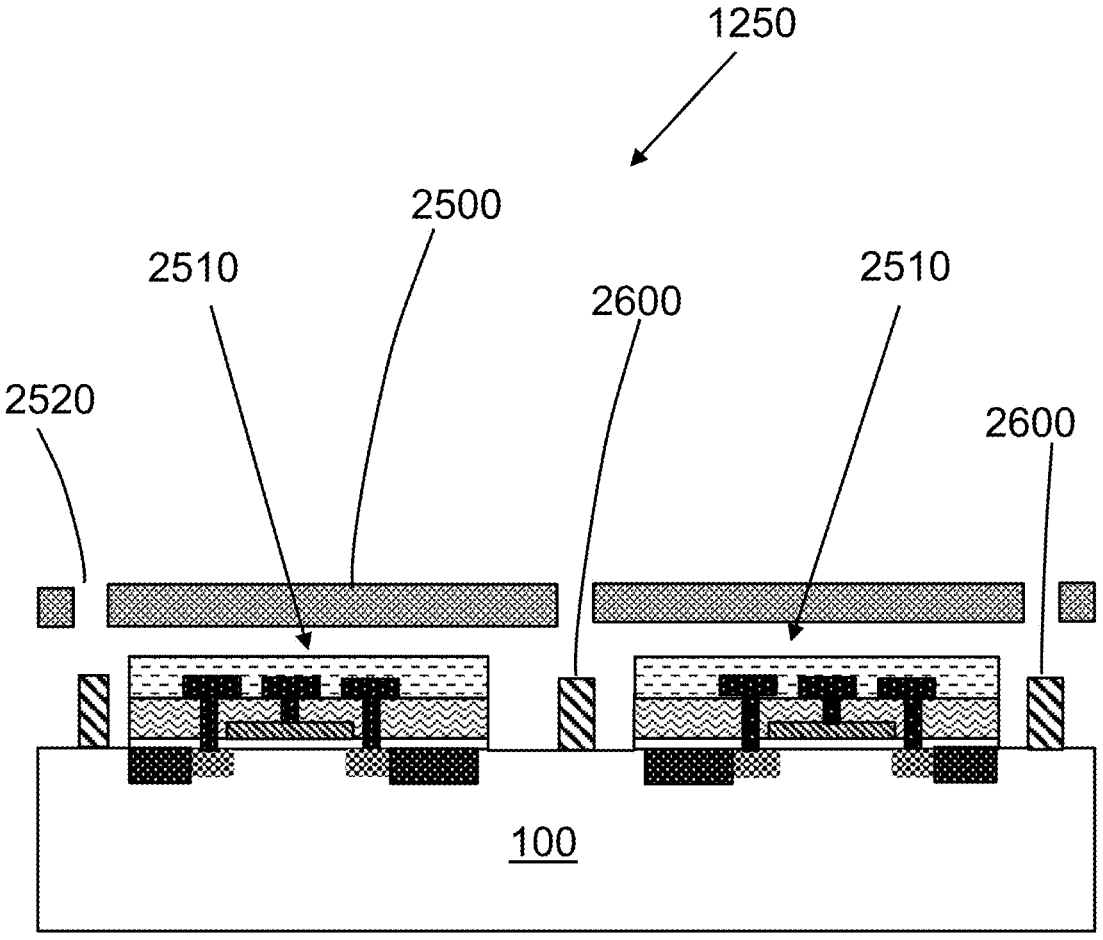
FIG. 26 is an illustration of carbon placed overlying dicing grid that bounds plurality of die 25 in accordance with an example embodiment.

FIG. 26 is an illustration of carbon 2600 placed overlying dicing grid 1250 that bounds plurality of die 2510 in accordance with an example embodiment. In the example embodiment, carbon 2600 is selectively deposited through plurality of openings 2520 by a process of sputtering such that carbon 2600 is deposited overlying dicing grid 1250 on semiconductor substrate. The thickness of carbon 2600 and a width of dicing grid 1250 are determined by the requirements of laser singulation process as described herein above.

Figure 27:
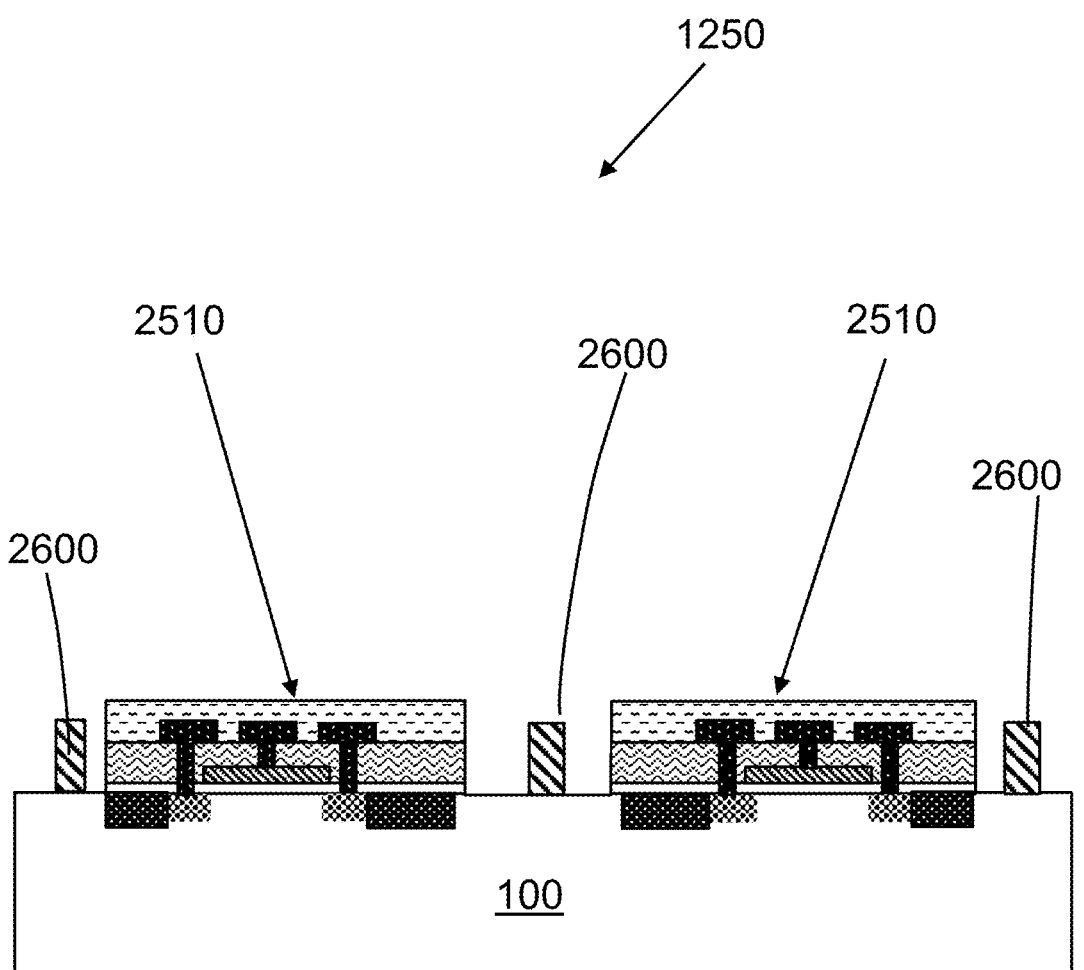
FIG. 27 is an illustration of carbon overlying dicing grid in accordance with an example embodiment.

FIG. 27 is an illustration of carbon 2600 overlying dicing grid 1250 in accordance with an example embodiment. Stencil mask 2500 of FIG. 26 is configured to selectively deposit carbon 2600 overlying semiconductor substrate 100. In the example embodiment, dicing grid 1250 bounds die 2510 and includes carbon 2600 overlying dicing grid 1250.

Carbon 2600 overlying stencil mask 2500 is removed from semiconductor substrate 100 when stencil mask 2500 is removed thus leaving carbon 2600 overlying dicing grid 1250. Subsequently, a laser is configured to deliver energy to carbon 2600 that heats carbon 2600 to create a thermal shock by temperature or temperature differential between carbon 2600 and semiconductor substrate 100 that produces vertical fractures within dicing grid 1250 that separates plurality of die 2510 on semiconductor substrate 100.

Figure 28:
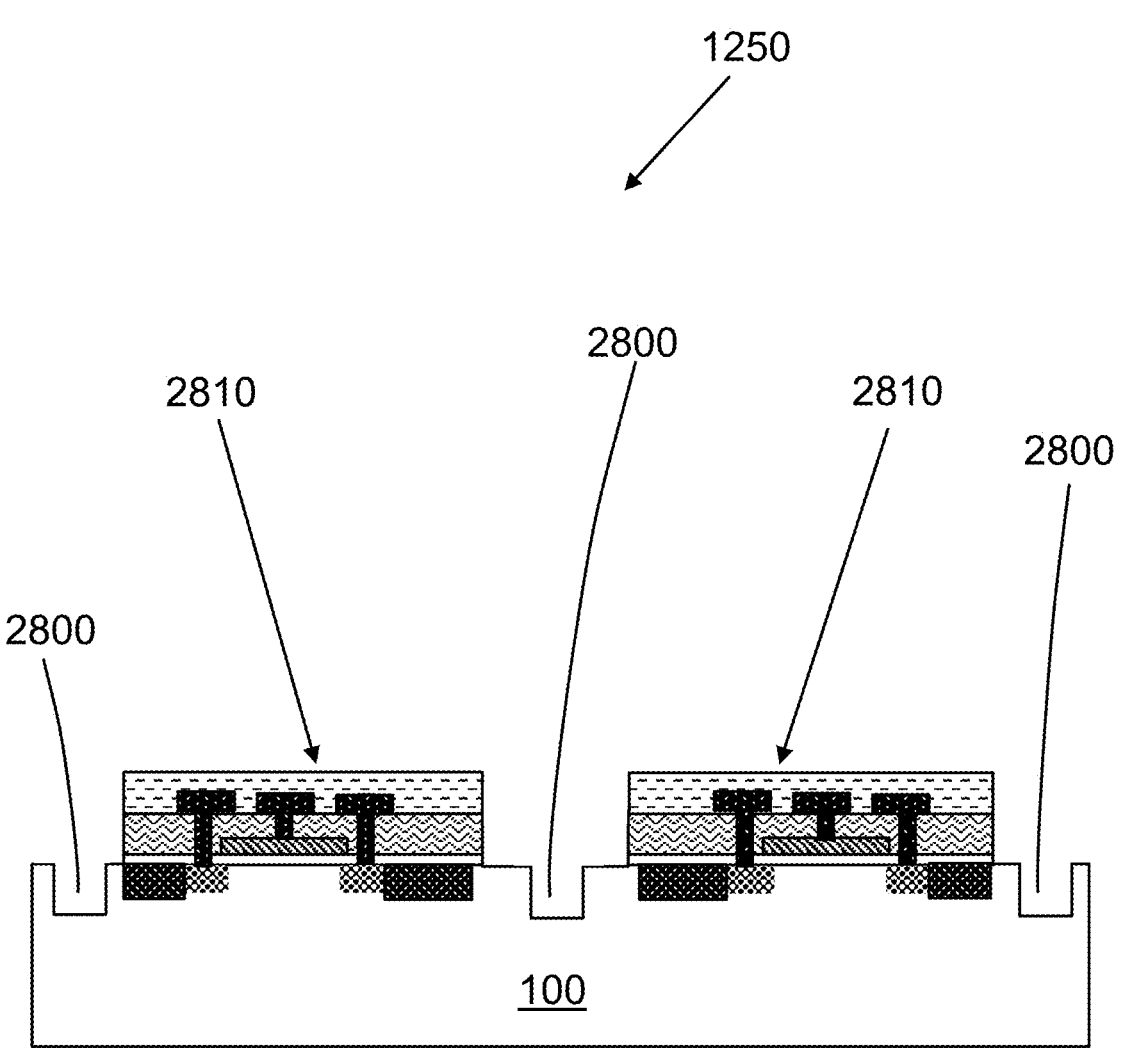
FIG. 28 is an illustration of grooves formed in the surface of semiconductor substrate in accordance with an example embodiment.

FIG. 28 is an illustration of grooves 2800 formed in the surface of semiconductor substrate 100 in accordance with an example embodiment. In the example embodiment, dicing grid 1250 bound plurality of die 2810 on semiconductor substrate 100. In one embodiment, grooves 2800 are formed using a mask with lithography and then applying etching techniques to form the recess as well known by one skilled in the art. In the example embodiment, grooves 2800 are formed by defining a pattern using lithography and using RIE (Reactive Ion Etching) to form the recessed portion within the dicing region between plurality of die 2810. In one embodiment, a width of grooves 2800 may be between 10-100 micrometers and the depth of groove 2800 may be between (0.5-10) microns. In the example embodiment, plurality of die 2810 are formed in or on the surface of semiconductor substrate 100. Similarly, dicing grid 1250 bounds all die formed on or in semiconductor substrate 100.

In an alternate embodiment, grooves 2800 can be formed using a laser. In one embodiment, grooves 2800 can be formed in dicing grid 1250 using a pulsed laser. In the example embodiment, grooves 2800 are formed as a notch in the surface of dicing grid 1250 that can be approximately V-shaped. In one embodiment, the notch will increase stress directed into semiconductor substrate 100 underlying grooves 2800 within dicing grid 1250. In one embodiment, the point of the V-shaped notch will have the highest stress and will be an initial point of fracture. A second laser is directed to provide energy into grooves 2800 that heat semiconductor substrate 100 locally in or near grooves 2800 in dicing grid 1250. The wavelength of the second laser is chosen such that the energy is absorbed by semiconductor substrate 100. In one embodiment, the second laser can be pulsed or CW (Continuous Wave). In one embodiment, the second laser is a continuous wave laser having a spot size approximately equal to or greater than a width of grooves 2800 to ensure energy delivery to grooves 2800. In the example, the energy from the second laser is absorbed by semiconductor substrate 100 within the surface of grooves 2800 within dicing grid 1250. In one embodiment, the energy from the second laser is converted to heat at a surface of semiconductor substrate corresponding to grooves 2800 within dicing grid 1250. The heating of grooves 280 produces thermal stress in semiconductor substrate 100 that fractures semiconductor substrate 100 underlying grooves 2800 thereby separating die of semiconductor substrate 100. In another embodiment, the second laser is a pulsed laser followed by rapid cooling to further increase the temperature differential between heated grooves 2800 and semiconductor substrate 100 within dicing grid 1250 that enhances the thermal stress. In the example, rapid cooling is achieved by using dry CO2 (carbon dioxide) to reduce the temperature of semiconductor substrate 1000 thereby increasing the temperature differential local to grooves 2800 and semiconductor substrate 100. Increasing the temperature differential increases thermal stress to further promote fracture of semiconductor substrate 100.

Figure 29:
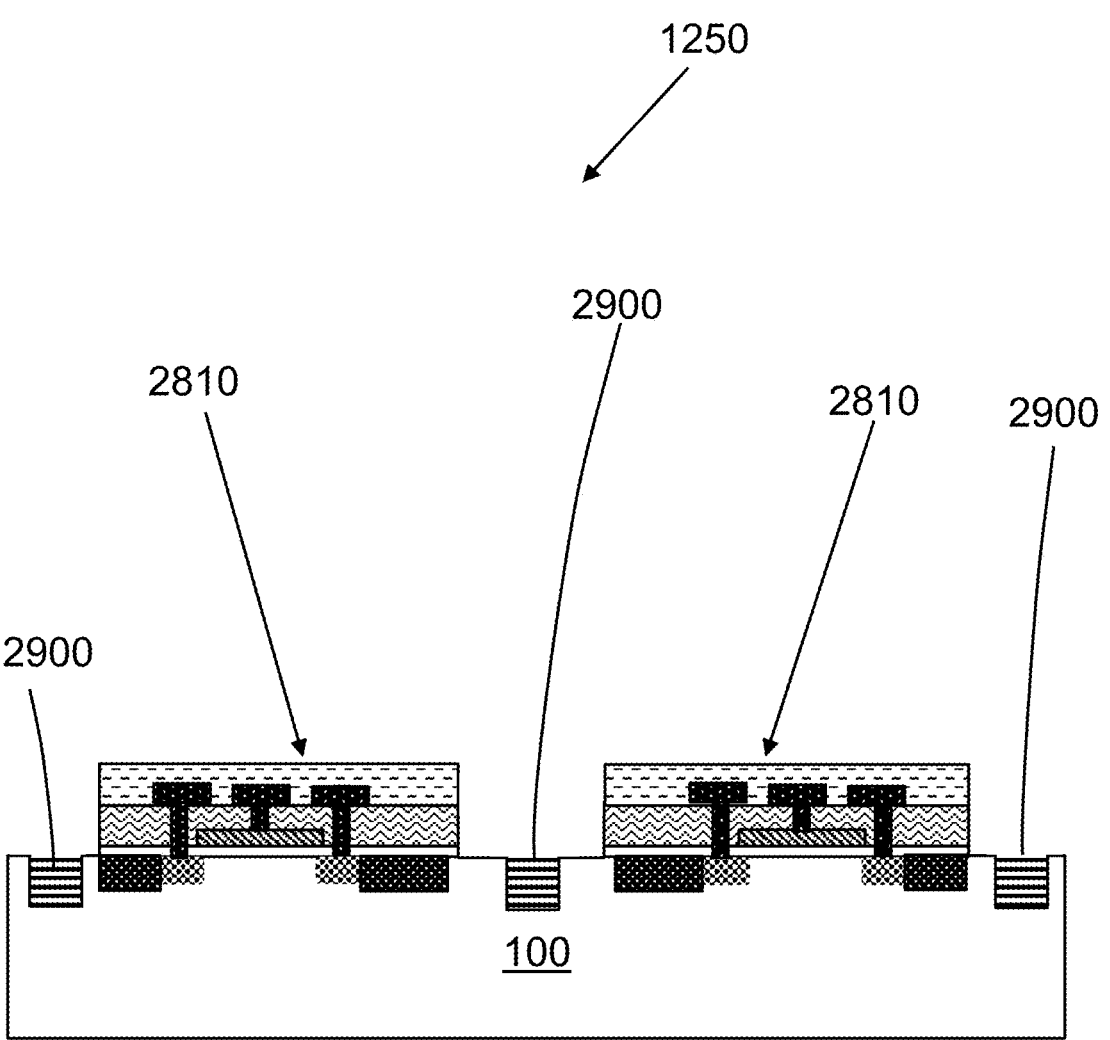
FIG. 29 is an illustration of a material placed in grooves of FIG. 28 in accordance with an example embodiment.

FIG. 29 is an illustration of a material 2900 placed in grooves 2800 of FIG. 28 in accordance with an example embodiment. Material 2900 is located in or on dicing grid 1250 bounding plurality of die 2810. Material 2900 is configured to facilitate singulation of plurality of die 2810 formed in or on semiconductor substrate 100. Plurality of die 2810 and dicing grid 1250 are formed throughout semiconductor substrate 100. In the example embodiment, material 2900 is a carbon layer formed on or in dicing grid 1250 which completely or partially fills grooves 2800 of FIG. 28. As disclosed herein material 2900 can comprise materials other than carbon. In another embodiment, material 2900 is configured to overlie grooves 2800 of FIG. 28. In one embodiment, dicing grid 1250 comprises carbon partially or completely filling groove 2800. The carbon is heated to a temperature or a temperature differential between material 2900 and semiconductor substrate 100 to create vertical fractures for singulation of plurality of die 2810. In one embodiment, a laser is used to heat material 2900 as an initial precursor for a fracture line when a thermal shock is initiated by the coupling of laser energy to material 2900 such as carbon in dicing grid 2900. In one embodiment, grooves 2800 are configured to support a vertical fracture with minimal defects within dicing grid 1250.

Figure 30:
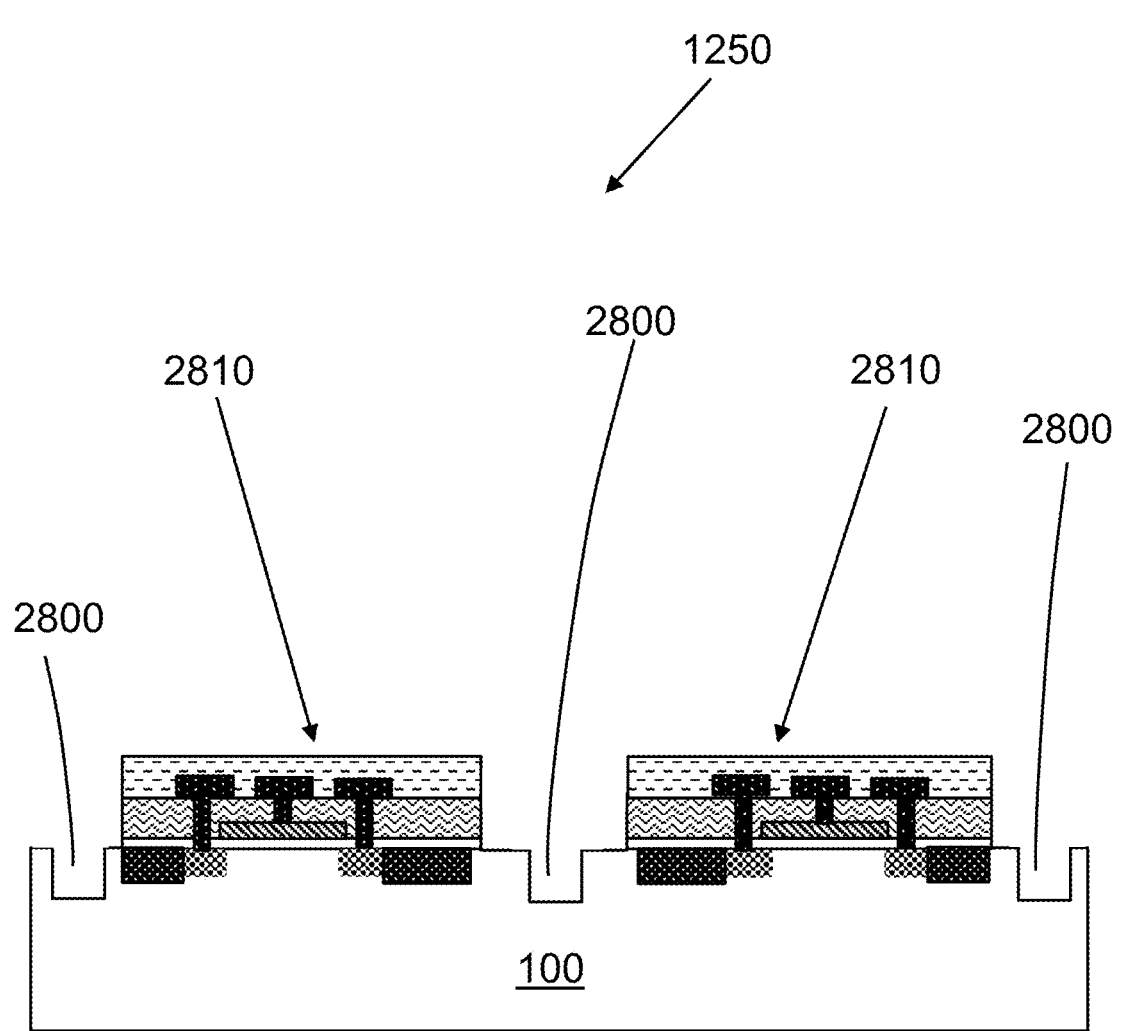
FIG. 30 is an illustration of grooves formed in dicing grid in accordance with an example embodiment.

FIG. 30 is an illustration of grooves 2800 formed in dicing grid 1250 in accordance with an example embodiment. In the example embodiment, grooves 2800 in the surface of semiconductor substrate 100 bound completed semiconductor die 2810. In one embodiment, grooves 2800 are formed by using a mask with lithography and then using etching techniques to form the recess as is well known by one skilled in the art. In the example embodiment, grooves 2800 are formed by defining a pattern using lithography and using etching to form the recessed portion in dicing grid 1250. The width of grooves 2800 may be between 10-100 micrometers and the depth of groove 2800 may be between (0.5-10) microns.

Figure 31:
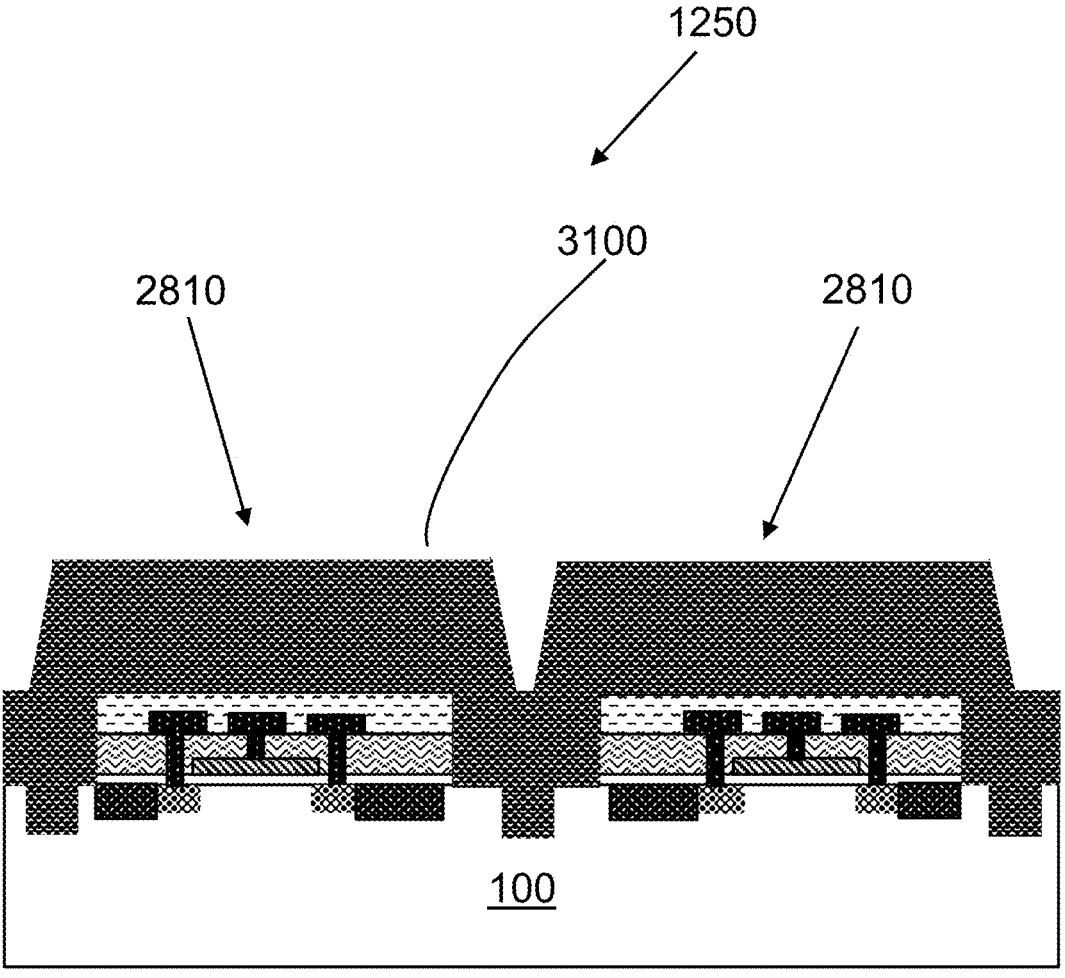
FIG. 31 is an illustration of a polymer deposited overlying semiconductor substrate in accordance with an example embodiment.

FIG. 31 is an illustration of a polymer 3100 deposited overlying semiconductor substrate 100 in accordance with an example embodiment. In the example, polymer 3100 coats plurality of die 2810, fills in grooves 2800 of FIG. 30, and coats dicing grid 1250. In the example embodiment, polymer 3100 is a photoresist material that is spin coated overlying the surface of semiconductor die 2810. In one embodiment, polymer 3100 is photoresist material having a thickness between (1-10) micrometers. Another polymer 3100 used to coat semiconductor substrate comprises CVD parylene in a vacuum environment.

Figure 32:
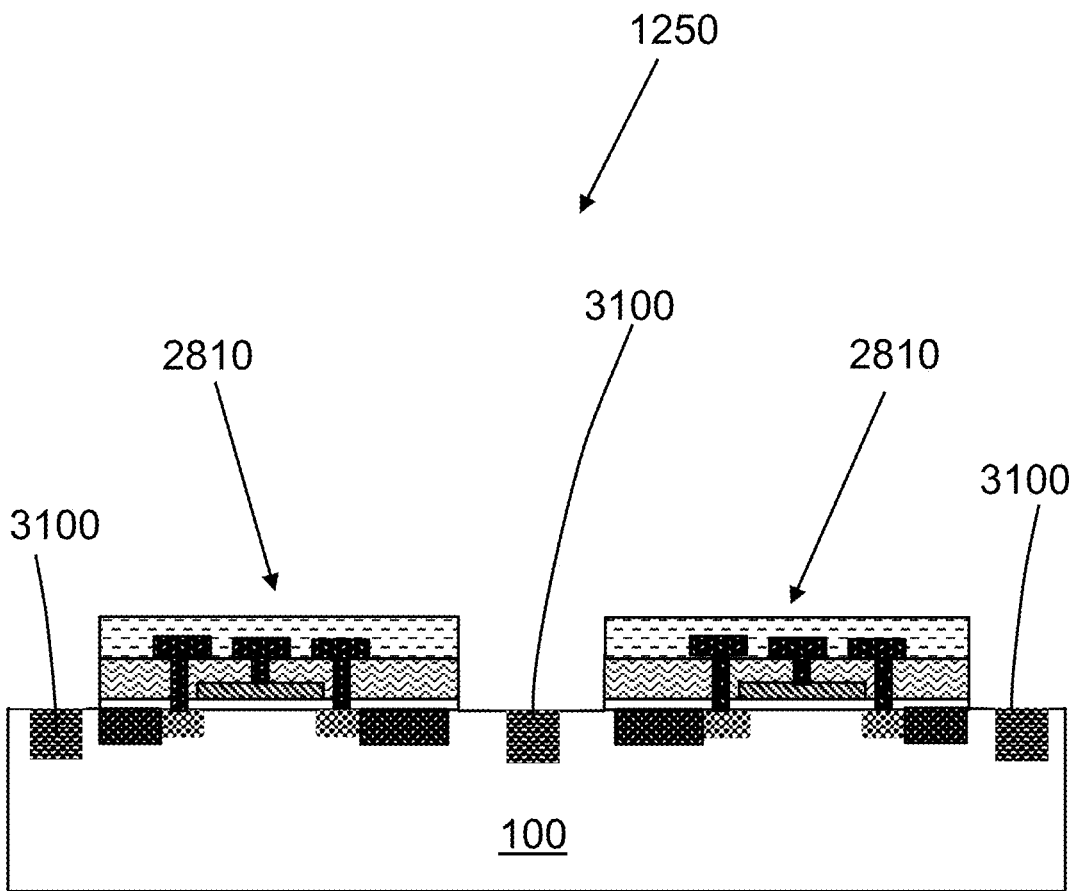
FIG. 32 is an illustration of polymer in grooves of FIG. 30 in accordance with an example embodiment.

FIG. 32 is an illustration of polymer 3100 in grooves 2800 of FIG. 30 in accordance with an example embodiment. Polymer 3100 is removed from semiconductor substrate 100 but is left selectively to completely or partially fill grooves 2800 from FIG. 30. In one embodiment, a blanket etch back of polymer 3100 is performed using a RIE (Reactive Ion Etching) using oxygen plasma to leave polymer 3100 completely filling grooves 2800 in dicing grid 1250. Dicing grid 1250 bounds plurality of die 2810 on or in semiconductor substrate 100 to support singulation of each die.

Figure 33:
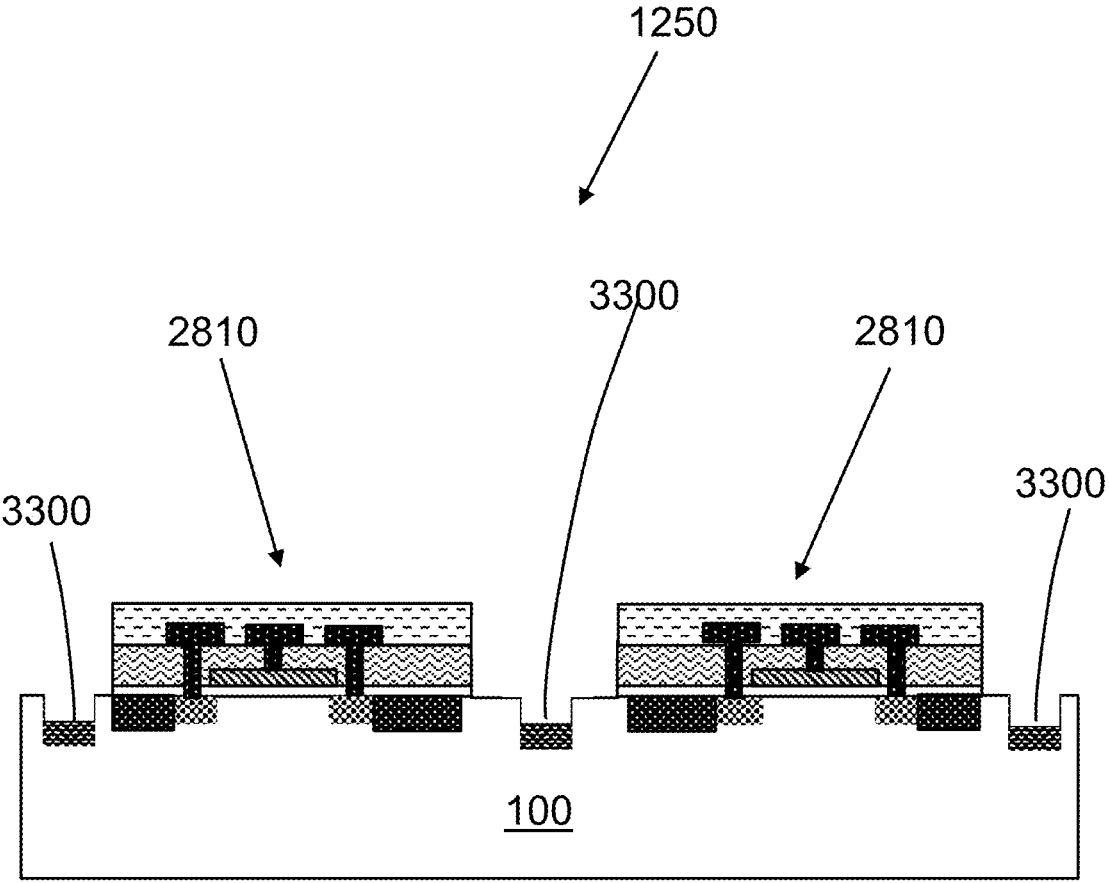
FIG. 33 is an illustration of a plurality of die comprising of semiconductor devices in a semiconductor substrate with a groove in the semiconductor substrate filled with a carbonized layer forming a dicing grid in accordance with an example embodiment.

FIG. 33 is an illustration of carbon 3300 in dicing grid 1250 in accordance with an example embodiment. Polymer 3100 of FIG. 32 in grooves 2800 of FIG. 30 is converted to carbon 3300 in dicing grid 1250. In one embodiment, a first laser in an inert environment is used to convert polymer 3100 to carbon 3300. In the example embodiment, the first laser is used to selectively heat polymer 3100 in dicing grid 1250 to a temperature greater than 800 C to form carbon in grooves 2800 of FIG. 30 of dicing grid 1250. In one embodiment, the thickness of carbon in dicing grid 1250 is less than the height of grooves 2800 of FIG. 30 due to shrinkage of polymer 3100 of FIG. 32 during a pyrolysis process to convert polymer 3100 to carbon 3300. The thickness of polymer 3100 is determined by the coating process as well as the etch back process. Dicing grid 1250 comprises carbon 3300 in grooves 2800 of FIG. 30 for singulation of plurality of die 2810. In the example, a second laser provides energy to carbon 3300 to heat carbon 3300 to produce vertical fractures through semiconductor substrate 100 in dicing grid 1250 for singulation of plurality of die 2810. Using the second laser provides an initial precursor for a fracture line when a thermal shock is initiated by the coupling of laser energy to carbon 3300 in dicing grid 1250. In another embodiment, a notch or groove is created in the dicing grid the surface of the semiconductor substrate using a pulsed laser and then a CW (Continuous Wave) laser is used to create a vertical fracture. In another embodiment, a notch is created using a pulsed laser followed by rapid cooling using dry CO2 to create the vertical fracture.

Figure 34:
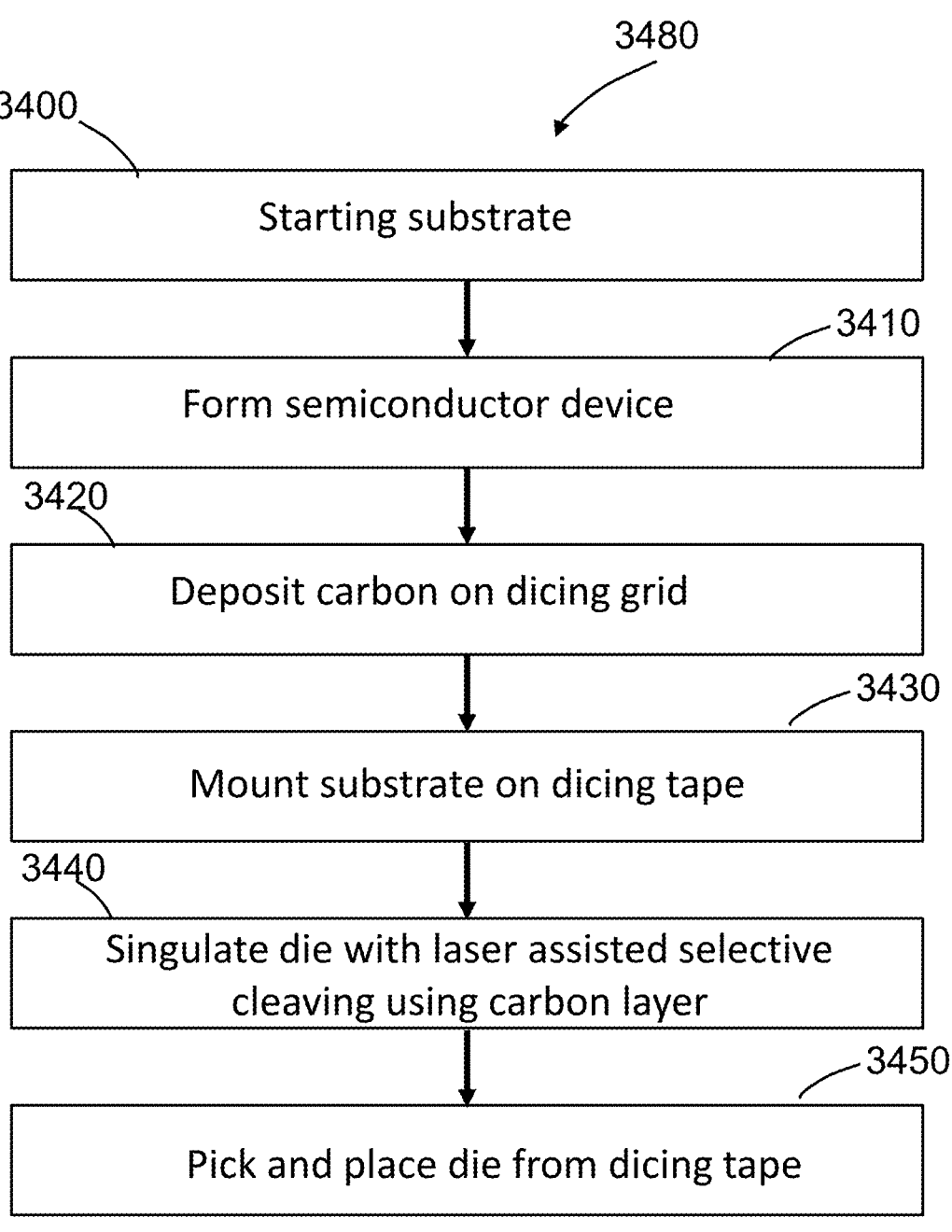
FIG. 34 is an illustration of a block diagram for a carbon assisted dicing of die of semiconductor devices formed on a semiconductor substrate in accordance with an example embodiment.

FIG. 34 is an illustration of a block diagram 3480 of a singulation process for separating die from a semiconductor substrate in accordance with an example embodiment. The order of the blocks in block diagram in FIG. 34 is for illustrative purposes only and does not imply an order or show all the specific steps in the implementation of the invention as are known by one skilled in the art.

Block 3400 discloses a semiconductor substrate used for the fabrication of semiconductor devices. In one embodiment, the semiconductor substrate is introduced prior to any semiconductor processing. The semiconductor substrate may be silicon, silicon carbide, gallium nitride among other materials. In block 3410 the semiconductor substrate is used for the fabrication of semiconductor devices using standard semiconductor processes of deposition, lithography and etch multiple times, as is known to those skilled in the art. In the example, the semiconductor substrate will have a plurality of die where each die comprises one or more devices, circuits, electrical or mechanical structures, or interconnect. Each die on the semiconductor substrate is bounded by a dicing grid having a predetermined width to support singulating each die from the semiconductor substrate. In block 3420, after the formation of semiconductor devices a material is deposited on or in the dicing grid on the semiconductor substrate. In block 3420, carbon is deposited on or in the dicing grid. Block 3430 is a step of mounting of the semiconductor substrate on a dicing tape. The semiconductor substrate has completed semiconductor die with carbon on or in a dicing grid. Block 3440 is a step of singulating die in the semiconductor substrate by selective cleaving of the semiconductor substrate within the dicing grid using a laser to couple energy to the carbon in the dicing grid to create vertical fractures to form individual die attached to dicing tape. In general, other materials other than carbon can be used on or in the dicing grid. The vertical fracture is created by heat of the material from energy coupled by the laser or a temperature differential between the material and the semiconductor substrate in the dicing grid. In one embodiment, the vertical fracture is created due to a thermal shock introduced by the laser to the material on or in the dicing grid. The thermal shock cleaves or creates a vertical fracture in the semiconductor structure from a surface of the dicing grid to a bottom surface of the dicing grid thereby singulating each semiconductor die on the semiconductor substrate. Block 3450 is a step of a removal of singulated die from the dicing tape using pick and place or equivalent assembly techniques as is known by one skilled in the art.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-34. In one embodiment, a semiconductor substrate 100 is configured for dicing into separate semiconductor devices 1010 where semiconductor devices 1010 form a die bounded by a dicing grid 1250. A material is configured to be placed on or in on dicing grid 1250 of semiconductor substrate 100 and a laser 1500 is configured to couple energy to the material of dicing grid 1250 thereby heating the material and dicing grid 1250 to introduce a thermal stress in semiconductor substrate 100 such that it fractures semiconductor substrate 100 into individual die corresponding to semiconductor devices 1010 bounded by dicing grid 1250.

In one embodiment, dicing grid 1250 of semiconductor substrate 100 comprises a straight line or a curve where dicing grid 1250 has predetermined width, predetermined height and a predetermined length to bound each die on the semiconductor substrate 100. Laser 1500 is configured to couple energy to the material on or in dicing grid 1250 wherein laser 1500 is configured to couple energy to the material on or in dicing grid 1250 thereby heating the material. Heating the material in or on dicing grid 1250 produces a vertical fracture 1550 beneath the material. Vertical fracture 1550 in semiconductor substrate 100 beneath the material of dicing grid 1250 is configured to have low defectivity. The low defectivity of the vertical fracture supports reduced width of dicing grid 1250. In one embodiment, semiconductor substrate 100 comprises silicon carbide or gallium nitride. In one embodiment, the material deposited on or in dicing grid 1250 comprises carbon 1220 or a material that can be converted to carbon. In another embodiment, material deposited on or in dicing grid 1250 comprises boron nitride or tantalum carbide.

In one embodiment, the material deposited on or in dicing grid 1250 in semiconductor substrate 100 is ink jet printed, sputtered, spin coated or deposited using stencil mask. In one embodiment, the thermal stress introduced to semiconductor substrate 100 by the material is a thermal shock produced by the temperature of the material or the temperature differential between the material and the semiconductor substrate 100 in dicing grid 1250. In one embodiment, the temperature of the material is heated in less than twenty nanoseconds. In one embodiment, the temperature of the material is heated in less than ten nanoseconds. In one embodiment, the temperature of the material is heated in less than five nanoseconds.

In one embodiment, the material produces a temperature differential between the material on or in semiconductor substrate 100 greater than 4000K to produce the thermal shock. In one embodiment, the material produces a temperature differential between the material on or in semiconductor substrate 100 greater than 3000K to produce the thermal shock. In one embodiment, the material produces a temperature differential between the material on or in semiconductor substrate 100 greater than 2000K to produce the thermal shock.

In one embodiment, the material on or in the dicing grid 1250 comprises carbon 1220. Carbon 1220 is heated with a laser 1500, of wavelength 1064 nm with a 35 micrometer spot size, peak laser power of 16000 Watts, wherein laser 1500 is pulsed having a pulse width of approximately 50 nSec, and wherein laser 1500 heats the material to approximately 4000K to produce the thermal shock.

In one embodiment, laser 1500 used to heat carbon 1220 on or in dicing grid 1250 is a pulsed or continuous wave laser. In one embodiment, laser 1500 has a wavelength of 532 nm, 1064 nm or 1950 nm.

In one embodiment, a laser having a first wavelength is configured to couple energy to the material on or in dicing grid 1250 followed by a second laser having a second wavelength to couple energy to the material. In one embodiment, first laser may use a wavelength to convert a polymer to carbon 1220 on or in dicing grid 1250 and the second laser is configured to have a wavelength to couple energy to carbon 1220 on or in dicing grid to produce a thermal shock that causes a vertical fracture. In another embodiment, a notch is created on the surface of the semiconductor substrate using a pulsed laser and then a CW (Continuous Wave) laser is used to create a vertical fracture.

In one embodiment, semiconductor substrate 100 includes dicing grid 1250 with grooves 2800 formed therein. A material is deposited that fills or partially fills groove 2800. In one embodiment, the material is configured to overlie groove 2800. In one embodiment the material is carbon.

In one embodiment, semiconductor substrate 100 is configured for dicing into separate die. Dicing grid 1250 bounds each die. Vertical fractures through dicing grid 1250 separates the die from one another on semiconductor substrate 100. A material is deposited on a dicing grid 1250 of semiconductor substrate 100. In one embodiment, semiconductor substrate 100 comprises gallium nitride or silicon carbide. Dicing grid 1250 defines a boundary of each die on semiconductor substrate 100. Each die comprises one or more semiconductor devices. In one embodiment, laser 1500 is configured to couple energy to the material on or in dicing grid 1250 thereby heating the material to produce a vertical fracture beneath the material through semiconductor substrate 100. Laser 1500 can be continuous or pulsed. The energy from laser 1500 is configured to heat the material on or in dicing grid 1250 to greater than 4000K thereby creating a thermal shock in semiconductor substrate 100 that fractures semiconductor substrate 100 beneath the material on or in dicing grid 1250 to separate die.

In one embodiment, the material on or in dicing grid 1250 of semiconductor substrate 100 is carbon, boron nitride, or tantalum carbide.

In one embodiment, laser 1500 used with semiconductor substrate 100 is pulsed or continuous wave and has a wavelength of 532 nm, 1064 nm or 1950 nm. In one embodiment, material used in dicing grid 1250 is heated in less than 50 nanoseconds to create a thermal shock.

In one embodiment, semiconductor substrate 100 is diced into separate die by thermal shock that creates vertical fractures in semiconductor substrate 100. In one embodiment, carbon is placed on or in dicing grid 1250. Dicing grid 1250 defines a boundary of each semiconductor die and wherein semiconductor substrate 100 comprises gallium nitride or silicon carbide. Carbon 1220 is heated by laser 1500 to produce a temperature differential between carbon 1220 on or in dicing grid 1250 and surface of gallium nitride or silicon carbide semiconductor substrate such that the temperature differential produces a vertical fracture in semiconductor substrate 100 to singulate die of semiconductor substrate 100.

Semiconductor substrate 100 is configured for dicing into separate die or individual semiconductor devices 1010. Dicing grid 1250 is configured to bound semiconductor devices 1010 on the semiconductor substrate 100. Material 1220 is configured to be placed on or in dicing grid 1250 of semiconductor substrate 100. Material 1220 comprises carbon, boron nitride, or tantalum carbide. In one embodiment, material 1220 is a material that is converted to carbon in a subsequent step. Laser 1500 is configured to couple energy to material 1220. In the example, material 1220 is carbon. The energy coupled by laser 1500 to material 1220 heats material 1220. The heat from the material couples to dicing grid 1250 to introduce a thermal stress in semiconductor substrate 100 that fractures semiconductor substrate 100 into individual die. In one embodiment, material 1220 is heated in less than 5 nanoseconds. In one embodiment, material 1220 is heated to produce a temperature differential between material 1220 and dicing grid 1250 of semiconductor substrate 100 greater than or equal to 3000K to produce a thermal shock. In one embodiment, laser 1500 has a wavelength of 532 nm, 1064 nm, or 1950 nm. In one embodiment, laser 1500 has a wavelength configured to impart energy to material 1220 efficiently and in less than 50 nanoseconds. In another embodiment, the pulsed laser is 532 nm or 1064 nm followed by a CW laser which can be 1064 nm or 1950 nm Semiconductor substrate 100 is configured for dicing into separate die or individual semiconductor devices 1010. Dicing grid 1250 bounds die or semiconductor devices 1010 on or in semiconductor substrate 100. A die singulation process is configured to occur in dicing grid 1250. Material 1220 is coupled to the dicing grid. Laser 1500 is configured to couple energy to material 1220 on or in the dicing grid 1250. The energy from laser 1500 is configured to heat the material to greater than 2000K thereby creating a thermal shock in the dicing grid that produces an approximately vertical fracture underlying material 1220 in dicing grid 1250 of semiconductor substrate 100 to singulate die. In one embodiment, material 1220 is heated in less than 20 nanoseconds.

Semiconductor substrate 100 is configured for dicing into separate die or individual semiconductor devices 1010. Dicing grid 1250 defines a boundary of each semiconductor device 1010 to be singulated. Semiconductor device 1010 can comprise a single semiconductor structure, an integrated circuit, multiple devices, or micro-electro mechanical structures (MEMs). In one embodiment, semiconductor substrate comprises gallium nitride or silicon carbide. Material 1220 such as carbon is coupled to dicing grid 1250. The carbon is configured to be heated to produce a temperature differential between the carbon and dicing grid 1250 to introduce a thermal stress that creates an approximately vertical fracture within dicing grid 1250 that is configured to separate semiconductor devices 1010 formed on or in semiconductor substrate 100.

What is claimed:

1. A method of dicing a semiconductor substrate into separate dies comprising:

depositing a layer of carbon directly on an uppermost front surface of the semiconductor substrate, wherein the uppermost front surface of the semiconductor substrate is opposite to a back surface of the semiconductor substrate;

wherein the layer of carbon is arranged in a dicing grid that bounds each die and wherein sidewalls and a top surface of the layer of carbon overlie the uppermost front surface of the semiconductor substrate; and heating the layer of carbon with one or more lasers wherein the one or more lasers are pulsed to generate a temperature differential of 2000 kelvins or more within a predetermined time period between the layer of carbon and the uppermost front surface such that heat from the layer of carbon and heat diffusion through the semiconductor substrate is configured to stress and vertically fracture starting at the uppermost front surface through the semiconductor substrate to separate the dies.

2. The method of claim 1 wherein the layer of carbon is ink jet printed, sputtered, or spin coated.

3. The method of claim 1 wherein the semiconductor substrate comprises silicon carbide.

4. The method of claim 1 wherein the semiconductor substrate comprises one of gallium arsenide, gallium nitride, indium phosphide, or silicon.

5. The method of claim 1 wherein a dicing region is part of the dicing grid that is used to define individual dies on the semiconductor substrate.

6. The method of claim 1 wherein the one or more lasers is configured to heat the layer of carbon in a range of 5 nanoseconds to 50 nanoseconds and diffuses the heat into the semiconductor substrate.

7. The method of claim 6 wherein the one or more lasers has a wavelength of 532 nm, 1064 nm, or 1950 nm.

8. The method of claim 6 wherein the semiconductor substrate is configured to be cooled using carbon dioxide to support diffusing heat through the semiconductor substrate.

9. The method of claim 1 wherein the one or more lasers has a spot size in a range of 10-100 micrometers in diameter.

10. The method of claim 1 wherein each die comprises a device formed in or overlying the uppermost front surface of the semiconductor substrate.

11. The method of claim 1 further including: coupling the semiconductor substrate to dicing tape; and removing the dies from the dicing tape after heating the layer of carbon arranged in the dicing grid that bounds each die.

12. A method of dicing a semiconductor substrate into separate dies comprising: depositing a layer of carbon directly on an uppermost front surface of the semiconductor substrate, wherein the uppermost front surface of the semiconductor substrate is opposite to a back surface of the semiconductor substrate; and wherein the layer of carbon is arranged in a dicing grid that bounds each die and wherein sidewalls and a top surface of the layer of carbon overlie the uppermost front surface of the semiconductor substrate; and heating the layer of carbon with a single pass of a laser such that heat from the layer of carbon transfers to the uppermost front surface, wherein the layer of carbon is heated for a time period between 5 and in 50 nanoseconds and heat diffuses through the semiconductor substrate thereby stressing the semiconductor substrate and produces a vertical fracture starting at the uppermost front surface and through the semiconductor substrate to separate the dies.

13. The method of claim 12 wherein each die comprises a device formed in or overlying the uppermost front surface of the semiconductor substrate.

14. The method of claim 12 wherein a spot size of the laser is 10-100 microns, wherein the spot size is equal to or greater than a width of the layer of carbon, and wherein the laser is pulsed.

15. The method of claim 12 wherein the semiconductor substrate comprises silicon carbide or gallium nitride.

16. The method of claim 12 wherein sidewalls and top surface of the layer of carbon overlie the uppermost front surface of the semiconductor substrate in the dicing grid.

17. A method of dicing a semiconductor substrate into separate dies comprising:

depositing a layer of carbon directly on an uppermost front surface of the semiconductor substrate, wherein the uppermost front surface of the semiconductor substrate is opposite to a back surface of the semiconductor substrate;

wherein the layer of carbon is arranged in a dicing grid that bounds each die and wherein sidewalls and a top surface of the layer of carbon overlie the uppermost front surface of the semiconductor substrate; and heating the layer of carbon with one or more lasers wherein the one or more lasers are pulsed to generate a thermal shock with a temperature differential greater than 2000 kelvins between the layer of carbon and the uppermost front surface, wherein heat from the layer of carbon is transferred to the uppermost front surface and wherein the heat diffuses though the semiconductor substrate such that heating and cooling the uppermost front surface produces a vertical fracture starting at the uppermost front surface through the semiconductor substrate to separate the dies.

18. The method of claim 17 wherein the semiconductor substrate comprises one of silicon carbide, gallium arsenide, gallium nitride, or indium phosphide.

19. The method of claim 17 wherein the dicing grid comprises the semiconductor substrate and wherein each die is formed in or overlying a same side of the semiconductor substrate as the uppermost major surface of the dicing grid.

20. The method of claim 17 wherein the semiconductor substrate is cooled to support heat diffusion.

21. The method of claim 17 wherein the one or more lasers has a spot size in a range of 10-100 micrometers in diameter.

* * * * *